(12) United States Patent  
Nakayama et al.

(10) Patent No.: US 11,758,629 B2  
(45) Date of Patent: *Sep. 12, 2023

(54) LOAD DRIVE DEVICE

(71) Applicant: Rohm Co., Ltd., Kyoto (JP)

(72) Inventors: Masaaki Nakayama, Kyoto (JP); Krishnachandran Krishnan Nair, Kyoto (JP); Mathew George, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

This patent is subject to a terminal disclaimer.

(21) Appl. No.: 17/879,123

(22) Filed: Aug. 2, 2022

(65) Prior Publication Data

US 2022/0394830 A1 Dec. 8, 2022

Related U.S. Application Data

(63) Continuation of application No. 16/628,136, filed as application No. PCT/JP2018/025023 on Jul. 2, 2018, now Pat. No. 11,438,981.

(30) Foreign Application Priority Data

Jul. 4, 2017 (JP) .................................. 2017130768

(51) Int. Cl.
*H05B 45/30* (2020.01)
*H05B 47/10* (2020.01)
(Continued)

(52) U.S. Cl.
CPC .............. *H05B 45/30* (2020.01); *B60Q 1/04* (2013.01); *B60Q 1/34* (2013.01); *H01L 33/00* (2013.01);
(Continued)

(58) Field of Classification Search
CPC .... H05B 45/30; H05B 45/3725; H05B 45/46; H05B 47/10; H05B 47/21; H05B 47/155; B60Q 1/04; B60Q 1/1407; B60Q 1/34
See application file for complete search history.

(56) References Cited

U.S. PATENT DOCUMENTS 5,528,127 A 6/1996 Streit
6,989,635 B2 * 1/2006 Iwaki ..................... H05B 45/10
315/200 A
(Continued)

FOREIGN PATENT DOCUMENTS

CN 101330070 12/2008
CN 201301374835 12/2009
(Continued)

OTHER PUBLICATIONS

Japan Patent Office, International Search Report for PCT/JP2018/025023 dated Sep. 18, 2018.
(Continued)

*Primary Examiner* — Thai Pham
(74) *Attorney, Agent, or Firm* — Fish & Richardson P.C.

(57) ABSTRACT

Provided is a load drive device comprising: a first input terminal for accepting an input of a first input current from a power source; a second input terminal for accepting an input of a second input current from the power source via an external resistor; an output terminal for outputting an output current to a load; a current distribution unit for summing the first input current and second input current at a prescribed distribution ratio and generating the output current and a control unit for controlling the distribution ratio. As one example, it would be appropriate for the control unit to control the distribution ratio according to the difference
(Continued)

between a first terminal voltage present in the second input terminal and a second terminal voltage present in the output terminal.

24 Claims, 21 Drawing Sheets

(51) Int. Cl.
*B60Q 1/04* (2006.01)
*B60Q 1/34* (2006.01)
*H01L 33/00* (2010.01)
*H02M 3/156* (2006.01)
*G05F 1/56* (2006.01)
*H02M 1/00* (2006.01)

(52) U.S. Cl.
CPC ............ *H02M 3/156* (2013.01); *H05B 47/10* (2020.01); *G05F 1/56* (2013.01); *H02M 1/0032* (2021.05)

(56) References Cited

U.S. PATENT DOCUMENTS

| | | | |
|---|---|---|---|
| 10,206,252 B2 * | 2/2019 | Galvano | ............ H05B 45/3725 |
| 2011/0254527 A1 | 10/2011 | Saito et al. | |
| 2012/0013320 A1 | 1/2012 | Moane | |
| 2013/0314064 A1 | 11/2013 | Theiler | |
| 2014/0292220 A1 * | 10/2014 | Trattler | .................. H05B 45/46 |
| | | | 323/283 |
| 2016/0255687 A1 * | 9/2016 | Zhang | .................... H05B 47/16 |
| | | | 315/210 |
| 2018/0054862 A1 * | 2/2018 | Takagimoto | ........... H05B 47/20 |
| 2020/0133320 A1 | 4/2020 | Nakayama et al. | |
| 2020/0359483 A1 * | 11/2020 | Saito | ...................... H05B 45/52 |

FOREIGN PATENT DOCUMENTS

| | | |
|---|---|---|
| DE | 102010054899 | 6/2012 |
| JP | 2008-010572 | 1/2008 |
| JP | 2014-215733 | 11/2014 |
| JP | 5897768 | 3/2016 |
| JP | 2016-058229 | 4/2016 |
| KR | 20150140905 | 12/2015 |
| WO | WO 2010/073401 | 7/2010 |
| WO | WO 2016/152272 | 9/2016 |

OTHER PUBLICATIONS

Patent Office of India, Office Action in Indian Appln. No. 201917054627, dated Nov. 13, 2020, 7 pages (with English Translation).

The State Intellectual Property Office of People's Republic of China, Office Action in Chinese Appln. No. 201880044218.3, dated Nov. 12, 2020, 12 pages (with English Translation).

* cited by examiner

LOAD DRIVE DEVICE

CROSS-REFERENCE TO RELATED APPLICATIONS

This application is a continuation application of Ser. No. 16/628,136, filed Jan. 2, 2020, which is a U.S. National Phase application under 35 U.S.C. § 371 of International Patent Application No. PCT/JP2018/025023, filed on Jul. 2, 2018, which claims the priority of Japanese Patent Application No. 2017-130768, filed on Jul. 4, 2017, the disclosure of which is incorporated herein by reference in its entirety.

TECHNICAL FIELD

The invention disclosed herein relates to a load drive device.

BACKGROUND ART

FIG. 17 is a diagram showing a conventional example of a semiconductor integrated circuit device. A load drive device X of this conventional example is a semiconductor integrated circuit device (what is called a driver IC) which receives an input of an input voltage Vin from a power source E and outputs an output voltage Vout and an output current Iout to a load Z.

An example of the conventional technology related to the above is disclosed in Patent Document 1 identified below.

CITATION LIST

Patent Document

Patent Document 1: Japanese Patent No. 5897768

SUMMARY OF INVENTION

Technical Problem

FIG. 18 is a diagram showing the output behavior of the load drive device X, illustrating, in order from top to bottom, a relationship between the input voltage Vin and the output voltage Vout, a relationship between the input voltage Vin and the output current Tout, and a relationship between the input voltage Vin and power consumption Pc.

As shown in the figure, the load drive device X performs, without depending on the input voltage Vin, an output feedback control to keep the output current Tout at a constant value. In the output feedback control, the output voltage Vout is determined depending on the characteristics of the load Z (for example, if the load Z is an LED (light emitting diode), depending on its forward voltage drop). The power consumption Pc is obtained as the product of the difference between the input and output voltages (Vin−Vout) and the output current Tout.

Accordingly, in the load drive device X, as the input voltage Vin rises, the power consumption Pc increases and also the amount of heat generation becomes large. Thus, for sufficient dissipation of heat from the load drive device X, the print-circuit board on which the load drive device X is mounted needs to have a large area, and this makes it difficult to install the load drive device X in a compact module.

An object of the invention disclosed herein is, in view of the above problem found by the inventors of the present application, to provide a load drive device capable of distributing power consumption in it.

Solution to Problem

A load drive device disclosed herein includes a first input terminal for accepting an input of a first input current from a power source, a second input terminal for accepting an input of a second input current from the power source via an external resistor, an output terminal for outputting an output current to a load, a current distributor configured to generate the output current by summing the first input current and the second input current at a prescribed distribution ratio, and a controller configured to control the distribution ratio (a first configuration).

Preferably, in the load drive device having the above-described first configuration, the current distributor includes a first transistor in a path in which the first input current flows, and the controller is configured to control an on-resistance value of the first transistor (a second configuration).

Preferably, in the load drive device having the above-described second configuration, the current distributor further includes a second transistor in a path in which the second input current flows, and the controller is configured to differentially control on-resistance values of the first transistor and the second transistor (a third configuration).

Preferably, in the load drive device having any one of the first to third configurations described above, the controller is configured to control the distribution ratio according to a difference value between a first terminal voltage appearing at the second input terminal and a second terminal voltage appearing at the output terminal (a fourth configuration).

Preferably, in the load drive device having the fourth configuration described above, the controller includes an input detector configured to generate a first differential input voltage from the first terminal voltage, an output detector configured to generate a second differential input voltage from the second terminal voltage, and a differential amplifier configured to generate a control signal for the current distributor according to a difference value between the first differential input voltage and the second differential input voltage (a fifth configuration).

Preferably, in the load drive device having the fifth configuration described above, the input detector is configured to generate the first differential input voltage by subtracting a prescribed threshold voltage from the first terminal voltage (a sixth configuration).

Preferably, in the load drive device having the fifth or sixth configuration described above, the output detector is configured to output a highest value of a plurality of the second terminal voltages as the second differential input voltage (a seventh configuration).

Preferably, in the load drive device having the fifth or sixth configuration described above, the output detector is configured to output an average value of a plurality of the second terminal voltages as the second differential input voltage (an eighth configuration).

Preferably, in the load drive device having any one of the first to third configurations described above, the controller is configured to control the distribution ratio according to a difference value between a terminal voltage appearing at the second input terminal and a prescribed reference voltage (a ninth configuration).

Preferably, the load drive device having any one of the first to ninth configurations described above further includes a current driver configured to perform constant current control of the output current (a tenth configuration).

Preferably, in the load drive device having the tenth configuration described above, the current distributor is integrated on a first-side side of the semiconductor chip, and the current driver is integrated on a second-side side of the semiconductor chip opposite to the first-side side of the semiconductor chip (an eleventh configuration).

Preferably, in the load drive device having the eleventh configuration described above, the current driver includes a plurality of constant current sources respectively connected between the current distributor and a plurality of the output terminals (a twelfth configuration).

Preferably, in the load drive device having the twelfth configuration described above, in plan view of the semiconductor chip, the plurality of constant current sources are arranged in a direction along the second side of the semiconductor chip (a thirteenth configuration).

Preferably, in the load drive device having the thirteenth configuration described above, in plan view of the semiconductor chip, the current distributor is integrated between a position adjacent to such a constant current source of the plurality of constant current sources as is located closest to a third side of the semiconductor chip and a position adjacent to such a constant current source of the plurality of constant current sources as is located farthest from the third side of the semiconductor chip (a fourteenth configuration).

Preferably, in the load drive device having any one of the first to fourteenth configurations described above, a terminal connected to the power source and a terminal adjacent to the terminal have withstand voltages sufficient to withstand connection to the power source (a fifteenth configuration).

Preferably, in the load drive device having the second configuration described above, the first transistor includes a source region, a source pad provided immediately close to the source region and wirebonded to the first input terminal, a drain region, and a drain pad provided immediately close to the drain region and wirebonded to the second input terminal (a sixteenth configuration).

Preferably, in the load drive device having any one of the first to sixteenth configurations described above, the first input terminal and the second input terminal are arranged adjacent to each other (a seventeenth configuration).

Preferably, in the load drive device having any one of the first to seventeenth configurations described above, an external terminal designable to have a high withstand voltage more easily than other external terminals is arranged adjacent to the first input terminal or the second input terminal (an eighteenth configuration).

Preferably, in the load drive device having any one of the first to eighteenth configurations described above, the first input terminal accepts the input of the first input current directly from the power source (a nineteenth configuration).

Preferably, in the load drive device having any one of the first to nineteenth configurations described above, the controller is configured to dynamically control the distribution ratio (a twentieth configuration).

Preferably, in the load drive device having any one of the first to twentieth configurations described above, the load drive device is integrated in a semiconductor device (a twenty-first configuration).

Preferably, in the load drive device having the second configuration described above, the controller is configured to dynamically control the on-resistance value of the first transistor (a twenty-second configuration).

Preferably, in the load drive device having the third configuration described above, the controller is configured to dynamically differentially control the on-resistance value of each of the first transistor and the second transistor (a twenty-third configuration).

Preferably, in the load drive device having the fourth configuration described above, the controller is configured to dynamically control the distribution ratio according to the difference value between the first terminal voltage and the second terminal voltage (a twenty-fourth configuration).

An electric appliance disclosed herein includes the load drive device having any one of the first to twenty-fourth configurations described above, an external resistor connected between a first input terminal and a second input terminal of the load drive device, and a load connected to an output terminal of the load drive device (a twenty-fifth configuration).

A lamp module disclosed herein includes the load drive device having any one of the first to twenty-fourth configurations, an external resistor connected between a first input terminal and a second input terminal of the load drive device, and a light source connected as a load to an output terminal of the load drive device (a twenty-sixth configuration).

A vehicle disclosed herein includes the lamp module having the twenty-sixth configuration described above, and a battery as a power source for the lamp module (a twenty-seventh configuration).

Preferably, in the vehicle having the twenty-seventh configuration described above, the lamp module is a headlamp module, a rear-lamp module, or a blinker-lamp module (a twenty-eighth configuration).

Advantageous Effects of Invention

According to the invention disclosed herein, it is possible to provide a load drive device capable of distributing power consumption in it.

DESCRIPTION OF EMBODIMENTS

<Electronic Appliance>

Figure 1:
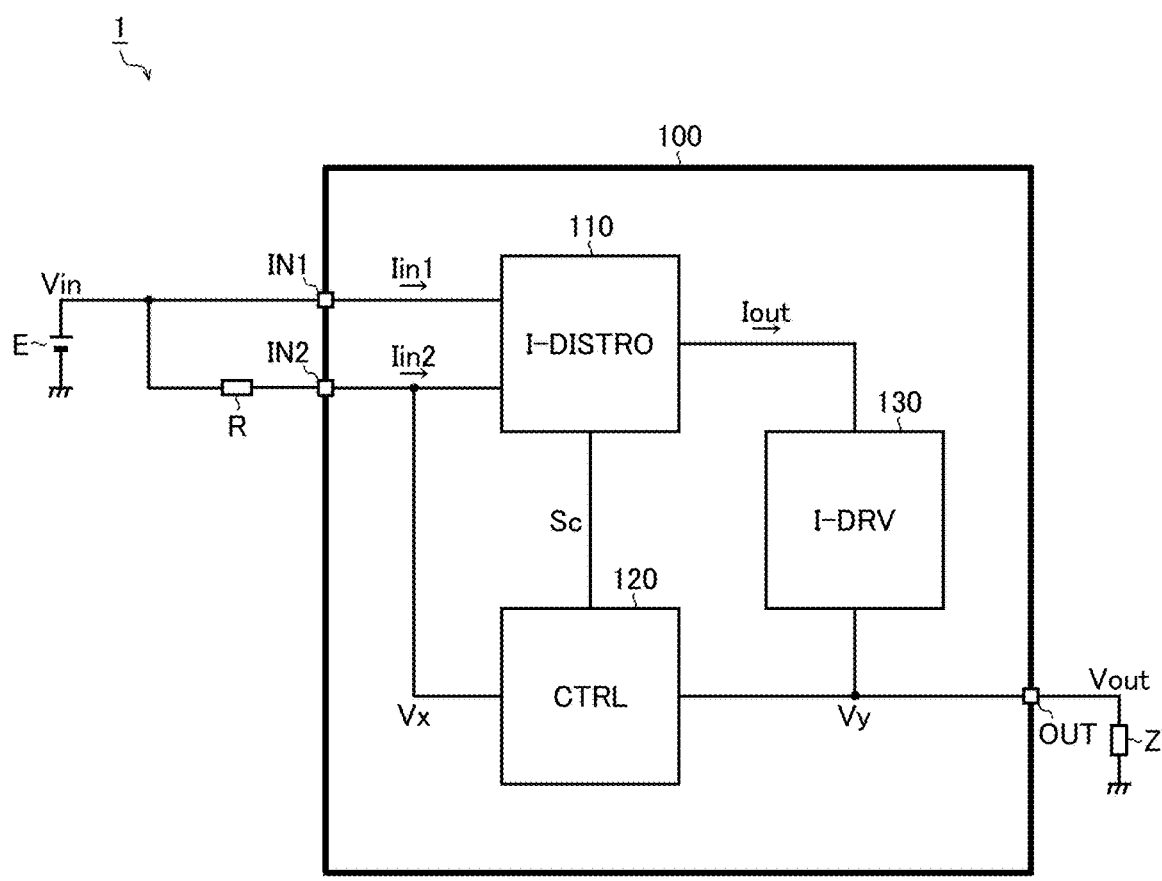
FIG. 1 is a diagram showing an overall configuration of an electric appliance including a load drive device.

FIG. 1 is a diagram showing an overall configuration of an electric appliance including a load drive device. An electric appliance 1 of this configuration example has a load drive device 100, an external resistor R, and a load Z, the load drive device 100 and the external resistor R being externally connected to the load drive device 100.

The load drive device 100 is a semiconductor integrated circuit device (what is called a driver IC) which receives an input of an input voltage Vin from a power source E and outputs an output voltage Vout and an output current Iout to the load Z, and, for establishing electrical connection with outside, the load drive device 100 has a first input terminal IN1, a second input terminal IN2, and an output terminal OUT. Needless to say, the load drive device 100 may be provided with more external terminals, as necessary, in addition to those mentioned above.

A first end of the external resistor R is connected to a positive end (=an input-voltage-Vin application end) of the power source E and to the first input terminal IN1 of the load drive device 100. A negative end of the power source E is connected to a ground end. A second end of the external resistor R is connected to the second input terminal IN2 of the load drive device 100. In this manner, the external resistor R is connected between the first and second input terminals IN1 and IN2 of the load drive device 100. Here, the load drive device 100 and the external resistor R may both be mounted on one common printed circuit board, or may be mounted on separate printed circuit boards one by one. Further, the external resistor R is not necessarily be a single resistor element, but instead may be composed of a plurality of resistor elements connected in series or in parallel with each other.

A first end of the load Z is connected to the output terminal OUT (=an output-voltage-Vout application end) of the load drive device 100. A second end of the load Z is connected to a ground end.

<Load Drive Device>

Still with reference to FIG. 1, a description will be given of an internal configuration of the load drive device 100. The load drive device 100 has, in addition to the first input terminal IN1, the second input terminal IN2, and the output terminal OUT mentioned above, a current distributor 110, a controller 120, and a current driver 130 integrated in it.

The first input terminal IN1 is an external terminal for accepting an input of a first input current Iin1 directly from the power source E.

The second input terminal IN2 is an external terminal for accepting an input of a second input current Iin2 from the power source E via the external resistor R.

The output terminal OUT is an external terminal for outputting the output voltage Vout and the output current Iout to the load Z.

The current distributor 110, based on a control signal Sc from the controller 120, sums the first input current Iin1 and the second input current Iin2 at a prescribed distribution ratio to generate the output current Tout.

The controller 120 continuously detects the difference value Vx−Vy (corresponding to the voltage drop between the input and output terminals) between a first terminal voltage Vx appearing at the second input terminal IN2 and a second terminal voltage Vy appearing at the output terminal OUT, and dynamically controls the aforementioned distribution ratio by generating the control signal Sc such that the detected value does not exceed a prescribed upper limit value. Specifically, until the difference value Vx−Vy reaches the prescribed upper limit value, basically only the first input current Iin1 is passed and the second input current Iin2 is cut off; on the other hand, after the difference value Vx−Vy has reached the prescribed upper limit value, the aforementioned distribution ratio is automatically and smoothly adjusted so as to reduce the first input current Iin1 and to increase the second input current Iin2. Here, as to the detection of the second terminal voltage Vy, a modification is possible where it is omitted. Such a modified example will be dealt with in connection with a third embodiment (FIG. 6), which will be described later.

The current driver 130 performs constant current control of the output current Iout. That is, the current driver 130 performs, without depending on the input voltage Vin, an output feedback control of the output current Iout to keep the output current Iout at a constant value.

Thus, the load drive device 100 of this configuration example has a function (hereinafter referred to as "the power consumption distribution function") of, at a time of the input voltage Vin rising, intentionally creating, by, for example, using the external resistor R provided outside the device (an input side), a loss of part of excessive power conventionally consumed inside the device.

The adoption of this configuration makes it possible to keep the power consumption inside the device constantly at or lower than a prescribed upper limit value, and thus to reduce heat generation in the load drive device 100. This provides a sufficient margin in the allowable power dissipation of the load drive device 100, and thus the load drive device 100 does not need to be mounted on an unnecessarily large printed circuit board and can be easily installed in a compact module.

Moreover, the input dynamic range of the load drive device 100 (=the range of the input voltage Vin that can be fed to the load drive device 100) is also widened, and thus, for example, a battery which provides an unstable input voltage Vin can be used as the power source E.

Furthermore, with the load drive device 100 of this configuration example, inside which no excessive power is applied, it is possible to reduce stress on internal elements, and thus to contribute to higher reliability and a longer product life.

The external resistor R is a discrete element and is more heat-resistant than the load drive device 100 which is a semiconductor device, and thus heat generation to some extent will cause no particular damage to the external resistor R.

Hereinafter, in connection with various embodiments, more specific descriptions will be given, dealing with examples of application to a multi-channel LED driver IC.

First Embodiment

Figure 2:
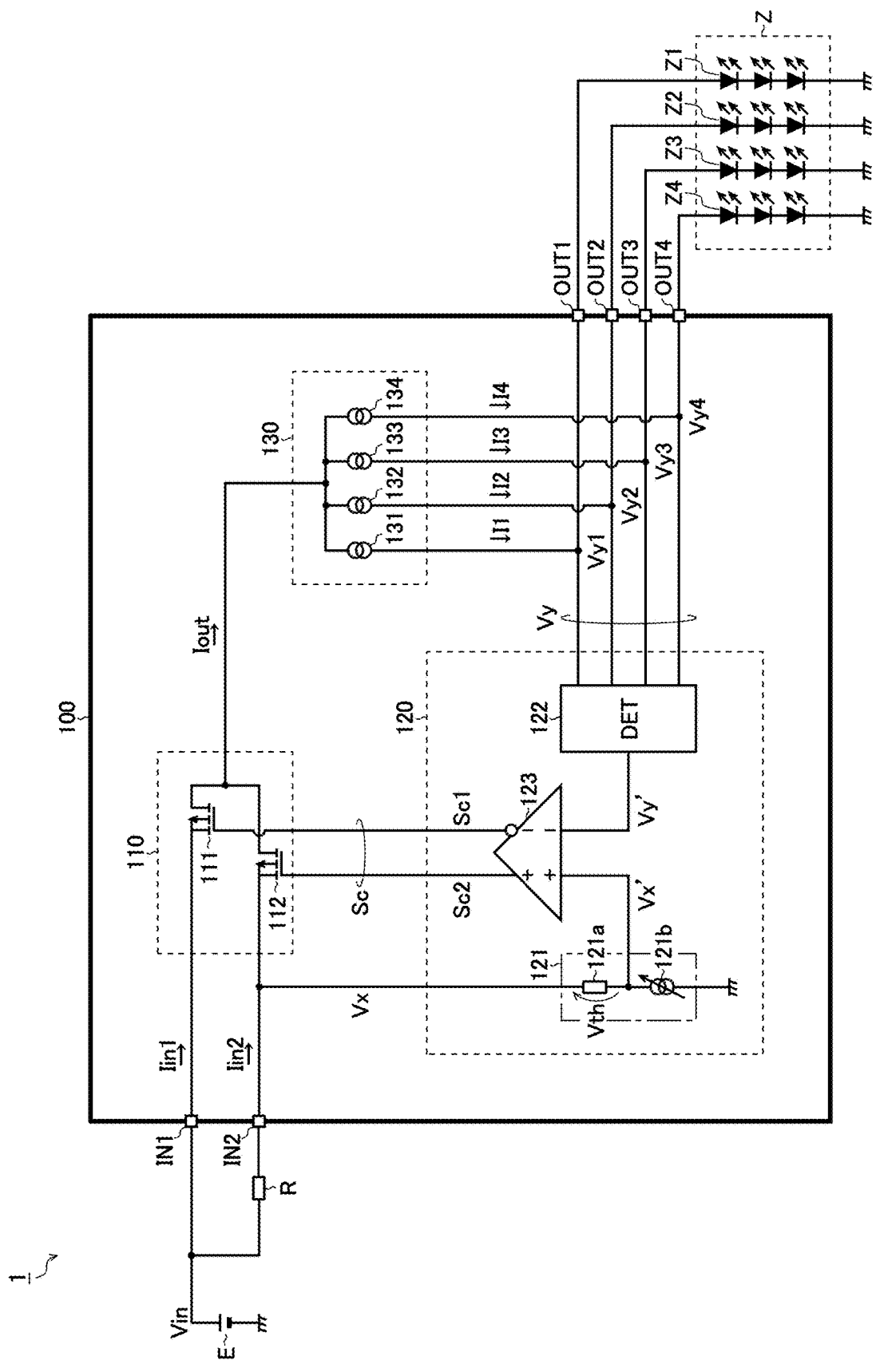
FIG. 2 is a diagram showing a first embodiment of an LED driver IC.

FIG. 2 is a diagram showing a first embodiment of an LED driver IC. In this embodiment, the electric appliance 1 described previously is configured as an LED lamp module, and the load drive device 100 is configured as a four-channel LED driver IC provided with output terminals OUT1 to OUT4. As the power source E, a battery is used, and, as the load Z, an LED light source is used which is provided with LED strings Z1 to Z4 arranged in parallel with each other.

Thus, in the following description, the electric appliance 1, the load drive device 100, the power source E, and the load Z will be read as an LED lamp module 1, an LED driver IC 100, a battery E, and an LED light source Z, respectively, and they will be described in detail.

The LED driver IC 100, together with the LED light source Z as its driving target, may be provided as the LED lamp module 1, or may be provided as a separate IC independent of the LED light source Z.

First, a current distributor 110, among the components of the LED driver IC 100, will be described. The current distributor 110 includes P-channel MOS (metal oxide semiconductor) field-effect transistors 111 and 112 as means for performing dynamic differential control of the distribution ratio between the first input current Iin1 and the second input current Iin2. The transistor 111 corresponds to a first transistor provided in a path (=direct path) in which the first input current Iin1 flows. On the other hand, the transistor 112 corresponds to a second transistor provided in a path (=a loss path) in which the second input current Iin2 flows.

Now, a specific description will be given of the interconnection among them. The source and the back gate of the transistor 111 are connected to the first input terminal IN1 (=a first input current-Iin1 input end). The source and the back gate of the transistor 112 are connected to the second input terminal IN2 (=a second input current-Iin2 input end). The drains of the transistors 111 and 112 are connected with each other, and the connection node between them is connected, as an output current-Iout output end, to the current driver 130 on a latter stage.

The gate of the transistor 111 receives a first control signal Sc1. Accordingly, as the first control signal Sc1 becomes higher, the on-resistance value of the transistor 111 becomes larger and the first input current Iin1 decreases. Reversely, as the first control signal Sc1 becomes lower, the on-resistance value of the transistor 111 becomes smaller and the first input current Iin1 increases.

On the other hand, the gate of the transistor 112 receives a second control signal Sc2. Accordingly, as the second control signal Sc2 becomes higher, the on-resistance value of the transistor 112 becomes larger and the second input current Iin2 decreases. Reversely, as the second control signal Sc2 becomes lower, the on-resistance value of the transistor 112 becomes smaller and the second input current Iin2 increases.

Between the gate and the source of each of the transistors 111 and 112, a voltage clamping element may be connected.

Next, the controller 120 will be described. The controller 120 includes an input detector 121, an output detector 122, and a differential amplifier 123, and generates, as the aforementioned control signal Sc, the first control signal Sc1 and the second control signal Sc2 to thereby perform dynamic differential control of the on-resistance values of the transistors 111 and 112.

The input detector 121 includes a resistor 121a and a current source 121b which are connected in series between the second input terminal IN2 and a ground end, and generates a first differential input voltage Vx' (=Vx−Vth) by subtracting a prescribed threshold voltage Vth (=a voltage appearing across the resistor 121a) from the first terminal voltage Vx appearing at the second input terminal IN2. To adjust the threshold voltage Vth as desired, it is preferable, for example, to use a variable current source as the current source 121b.

The output detector 122 generates a second differential input voltage Vy' from second terminal voltages Vy1 to Vy4 (corresponding to the aforementioned second terminal voltage Vy) appearing at the output terminals OUT1 to OUT4, respectively. The second terminal voltages Vy1 to Vy4 are determined depending on the forward voltage drops of the LED strings Z1 to Z4, respectively.

Preferably, for example, the output detector 122 is configured to output the highest value of the second terminal voltages Vy1 to Vy4 as the second differential input voltage Vy'. In such a configuration, the aforementioned power consumption distribution function stays off until the first differential input voltage Vx' reaches the largest of the second terminal voltages Vy1 to Vy4. Accordingly, even if the LED strings Z1 to Z4 have different numbers of series-connected LED stages or different forward voltage drops, it is possible to securely turn on all of the LED strings Z1 to Z4.

Or, for example, the output detector 122 may be configured to output the average value of the second terminal voltages Vy1 to Vy4 as the second differential input voltage Vy'. In such a configuration, the aforementioned power consumption distribution function is turned on at a time point that the first differential input voltage Vx' has reached the average value of the second terminal voltages Vy1 to Vy4. Accordingly, even if the LED strings Z1 to Z4 have different numbers of series-connected LED stages or different forward voltage drops, the LED strings Z1 to Z4 are each unlikely to receive an excessive voltage.

The differential amplifier 123 generates the first control signal Sc1 and the second control signal Sc2 according to the difference value Vx'−Vy' between the first differential input voltage Vx' fed to its non-inverting input terminal (+) and the second differential input voltage V' fed to its inverting input terminal (−). A static electricity protection device may be connected to the input stage of the differential amplifier 123.

Now, a specific description will be given of the operation of the differential amplifier 123. When Vx'−Vy'≤0 (that is, Vx−Vy≤Vth) holds, the first control signal Sc1 output from the inverting output terminal (−) of the differential amplifier 123 stays at low level, and the second control signal Sc2 output from the non-inverting output terminal (+) of the differential amplifier 123 stays at high level. Accordingly, in the current distributor 110, the transistor 111 is fully on and the transistor 112 is fully off, that is, only the first input current Iin1 in the direct path is passed and the second input current Iin2 in the loss path is cut off.

On the other hand, when Vx'−Vy'>0 (that is, Vx−Vy>Vth) holds, the first control signal Sc1, having stayed at low level, rises from low level, and the second control signal Sc2, having stayed at high level, lowers from high level, and thus the on-resistance value of the transistor 111 is raised from its lowest value and the on-resistance value of the transistor 112 is lowered from its highest value. As a result, in the current distributor 110, the distribution ratio between the first input current Iin1 and the second input current Iin2 is automatically and smoothly adjusted so as to reduce the first input current Iin1 and to increase the second input current Iin2.

In this manner, in the controller 120, the distribution ratio between the first input current Iin1 and the second input current Iin2 is dynamically differentially controlled according to the difference value Vx−Vy between the first terminal voltage Vx and the second terminal voltage Vy.

Next, the current driver 130 will be described. The current driver 130 includes constant current sources 131 to 134 connected in parallel with each other. The constant current sources 131 to 134 generate prescribed constant currents I1 to I4, respectively, and output the constant currents to the output terminals OUT1 to OUT4, respectively. Accordingly, the output current Iout fed from the current distributor 110 to the current driver 130 is a sum current (Iout=I1+I2+I3+I4) resulting from summing up all the constant currents I1 to I4. Although not clearly shown in this figure, the current driver 130 may include a logic unit or the like as the leading agent to perform the output feedback control of the constant currents I1 to I4.

Figure 3:
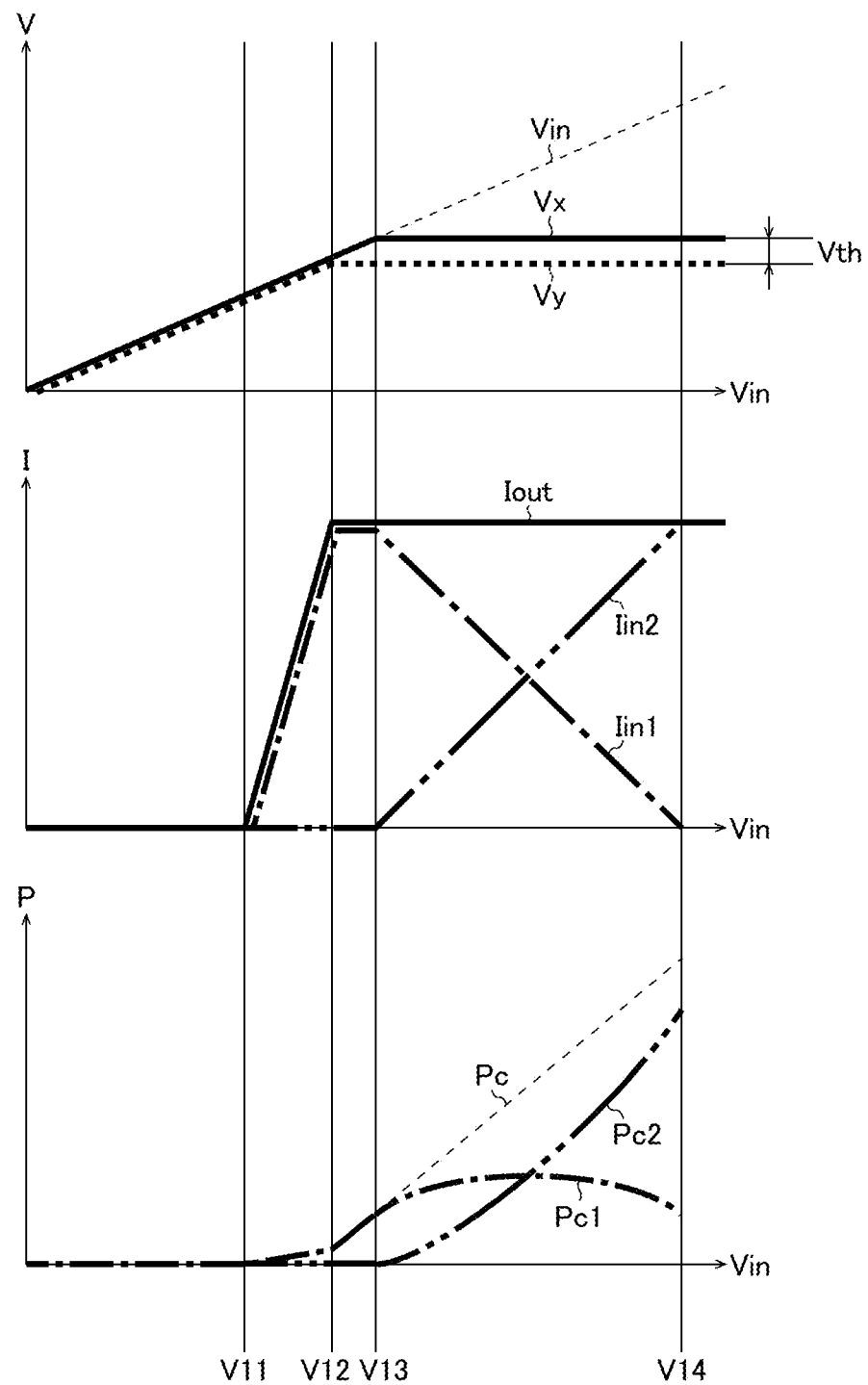
FIG. 3 is a diagram showing an example of power consumption distribution control performed in the first embodiment.

FIG. 3 is a diagram showing an example of power consumption distribution control in the LED driver IC 100 of the first embodiment (FIG. 2), illustrating, in order from top to bottom, a relationship between the input voltage Vin and various voltages (Vx, Vy), a relationship between the input voltage Vin and various currents (Iin1, Iin2, Iout), and a relationship between the input voltage Vin and various power consumptions (Pc1, Pc2, Pc). Here, Pc1 represents the internal power consumption, which is the amount of power consumed in the LED driver IC 100, and Pc2 represents the external power consumption, which is the amount of power consumed in the external resistor R. Pc represents the conventional power consumption (=corresponding to the internal power consumption in a case where the power consumption distribution control is not performed).

In a first voltage range (0≤Vin<V11), as the input voltage Vin rises, the first terminal voltage Vx and the second terminal voltage Vy both rise. In the first voltage range, however, the second terminal voltage Vy does not exceed the forward voltage drop of the LED light source Z (more precisely, the lowest value of the forward voltage drops of the LED strings Z1 to Z4), the output current Iout does not flow. Accordingly, the first input current Iin1 and the second input current Iin2 both stay at the zero value, and the internal power consumption Pc1 and the external power consumption Pc2 also stay at the zero value.

In a second voltage (V11≤Vin<V12), the second terminal voltage Vy becomes higher than the forward voltage drop of the LED light source Z, and the output current Iout starts to increase. In the second voltage range, however, Vx−Vy<Vth holds, and thus the power consumption distribution function does not work, and the second input current Iin2 does not flow. Accordingly, the output current Iout is generated entirely from the first input current Iin1. As a result, the internal power consumption Pc1 starts to increase, but the external power consumption Pc2 is kept at the zero value.

In a third voltage range (V12≤Vin<V13), the output current Iout reaches its target value (for example, 450 mA) and the second terminal voltage Vy stops rising, and thus, as the input voltage Vin rises, the difference between the first terminal voltage Vx and the second terminal voltage Vy starts to increase. However, in the third voltage range, Vx−Vy<Vth still holds, and thus, as in the second voltage range described above, the power consumption distribution control does not work, and the second input current Iin2 does not flow. Accordingly, the internal power consumption Pc1 further increases, but on the other hand, the external power consumption Pc2 is kept at the zero value.

In a fourth voltage range (V13≤Vin<V14), Vx−Vy>Vth holds, and the power consumption distribution function starts to work. More specifically, in the fourth voltage range, the transistors 111 and 112 operate so as to make Vx−Vy=Vth hold, and the distribution ratio between the first input current Iin1 and the second input current Iin2 is automatically and smoothly adjusted such that as the input voltage Vin becomes higher, the first input current Iin1 is reduced and the second input current Iin2 is increased.

The provision of such power consumption distribution function makes it possible to intentionally create, as the power consumption Pc2, a loss of part of excessive power supplied from the battery E. This makes it possible to keep the internal power consumption Pc1 substantially at a constant value (about one sixth of the conventional value), and thus to downsize the printed circuit board on which the LED driver IC 100 is mounted and to obtain a large output current from the LED driver IC 100.

In particular, in the LED lamp module 1 for which the power source is the battery E, the input voltage Vin is likely to become unstable and the allowable power dissipation of the LED driver IC 100 is highly likely to be exceeded, and thus it is very advantageous to regulate the internal power consumption Pc1 by the power consumption distribution function.

Figure 18:
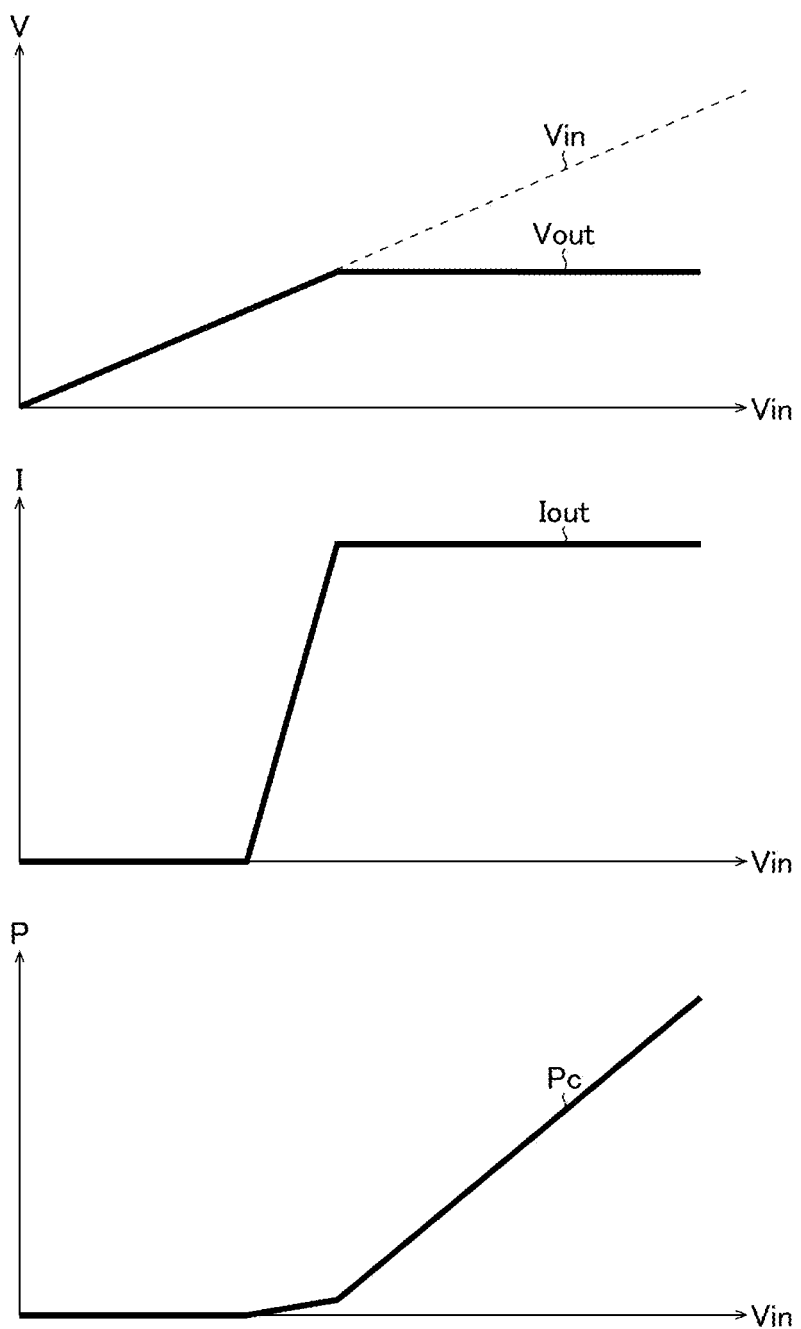
FIG. 18 is a diagram showing an example of an output behavior observed in the conventional example.

As shown in this figure, the characteristics of the output current Iout generated by summing the first input current Iin1 and the second input current Iin2 are equivalent to those of the conventional example (FIG. 18). Accordingly, in introducing the power consumption distribution function, there is no need of redesigning the current driver 130.

Second Embodiment

Figure 4:
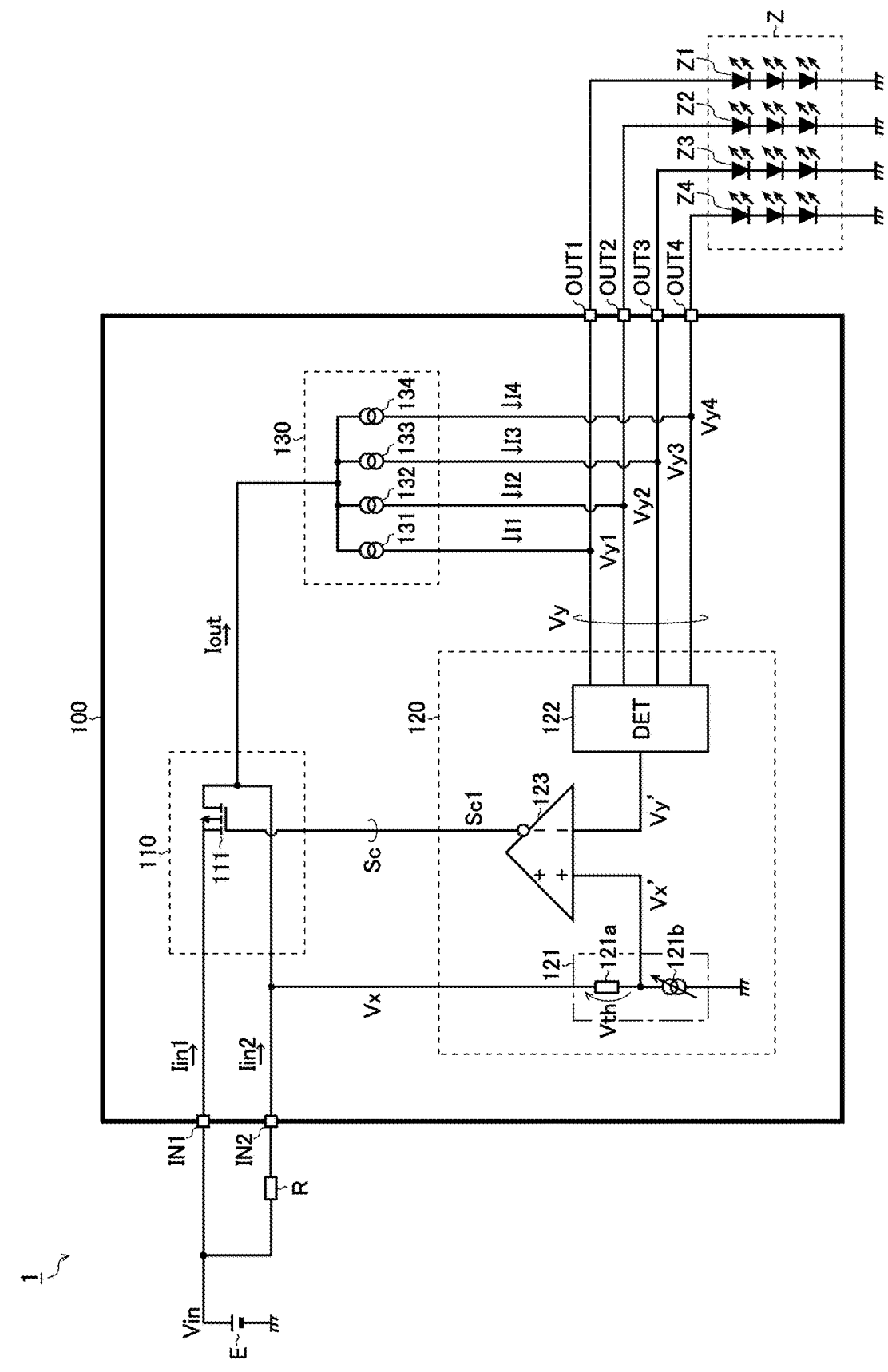
FIG. 4 is a diagram showing a second embodiment of an LED driver IC.

FIG. 4 is a diagram showing a second embodiment of an LED driver IC. Although this embodiment is based on the above-described first embodiment (FIG. 2), in the LED driver IC 100 of this embodiment, the transistor 112 of the current distributor 110 is omitted, and thus the controller 120 dynamically controls the on-resistance value of the transistor 111 by using only the first control signal Sc1. According to this configuration, it is possible to implement the power consumption distribution function substantially equal to that of the first embodiment in a simple manner.

Figure 5:
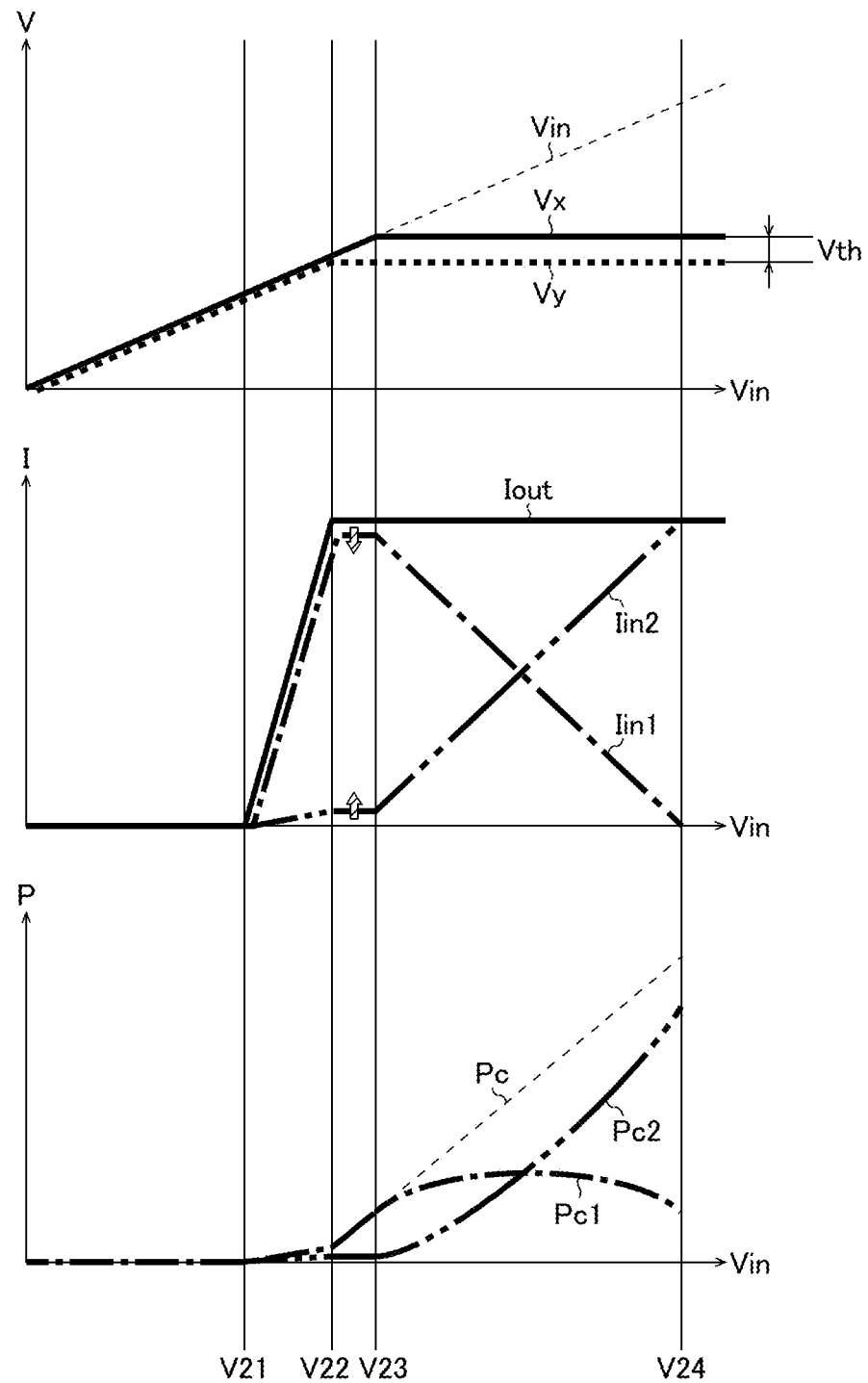
FIG. 5 is a diagram showing an example of power consumption distribution control performed in the second embodiment.

FIG. 5 is a diagram showing an example of power consumption distribution control performed in the LED driver IC 100 of the second embodiment, and illustrates, as in FIG. 3, in order from top to bottom, a relationship between the input voltage Vin and various voltages (Vx, Vy), a relationship between the input voltage Vin and various currents (Iin1, Iin2, Iout), and a relationship between the input voltage Vin and various power consumptions (Pc1, Pc2, Pc).

The basic operation of this embodiment is performed in the same manner as described previously, and can be understood simply by reading the voltage values V11 to V14 in FIG. 3 as the voltage values V21 to V24, respectively, in this figure.

Since the transistor 112 is omitted in the LED driver IC 100 of this embodiment, even in an input voltage range (V21<Vin<V23) in which the power consumption distribution function does not work, the second input current Iin2 flows in the loss path, by which amount the first input current Iin1 decreases.

However, by setting the resistance value of the external resistor R at a sufficiently large value (about 10Ω) with respect to the on-resistance value (about 0.5Ω) of the transistor 111 when it is fully on, it is possible to make the second input current Iin2 sufficiently low, and thus no trouble occurs in the operation of the LED driver IC 100.

Third Embodiment

Figure 6:
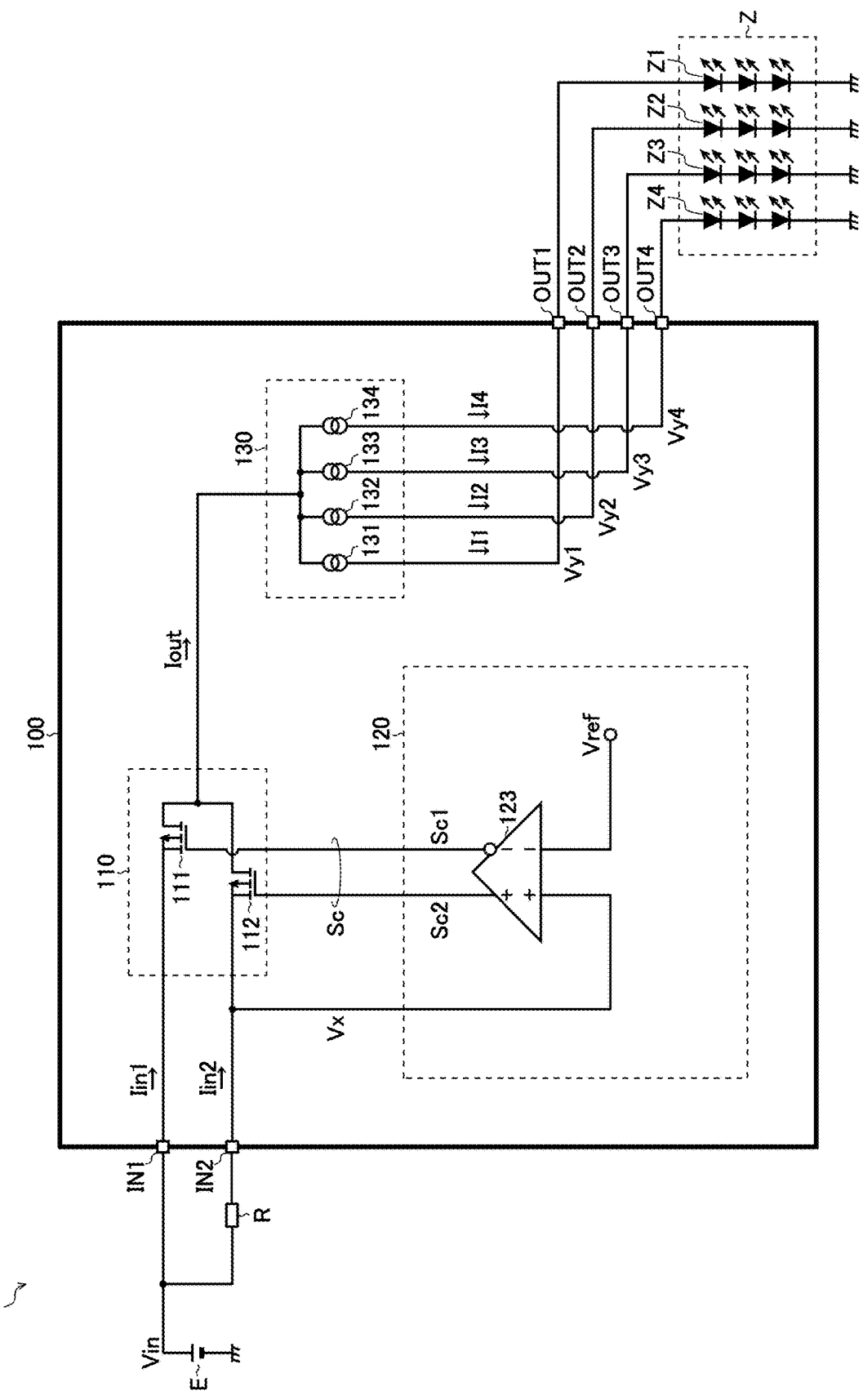
FIG. 6 is a diagram showing a third embodiment of an LED driver IC.

FIG. 6 is a diagram showing a third embodiment of an LED driver IC. Although this embodiment is based on the above-described first embodiment (FIG. 2), in the LED driver IC 100 of this embodiment, the input detector 121 and the output detector 122 of the controller 120 are both omitted, and thus the controller 120 dynamically controls the distribution ratio between the first input current Iin1 and the second input current Iin2 according to the difference value Vx−Vref between the first terminal voltage Vx and a prescribed reference voltage Vref. According to this configuration, it is possible to implement the power consumption distribution function substantially equal to that of the first embodiment in a simple manner.

Here, the reference voltage Vref can be set at a voltage value that is higher than the expected value of the second terminal voltage Vy by the threshold voltage Vth mentioned previously.

Figure 7:
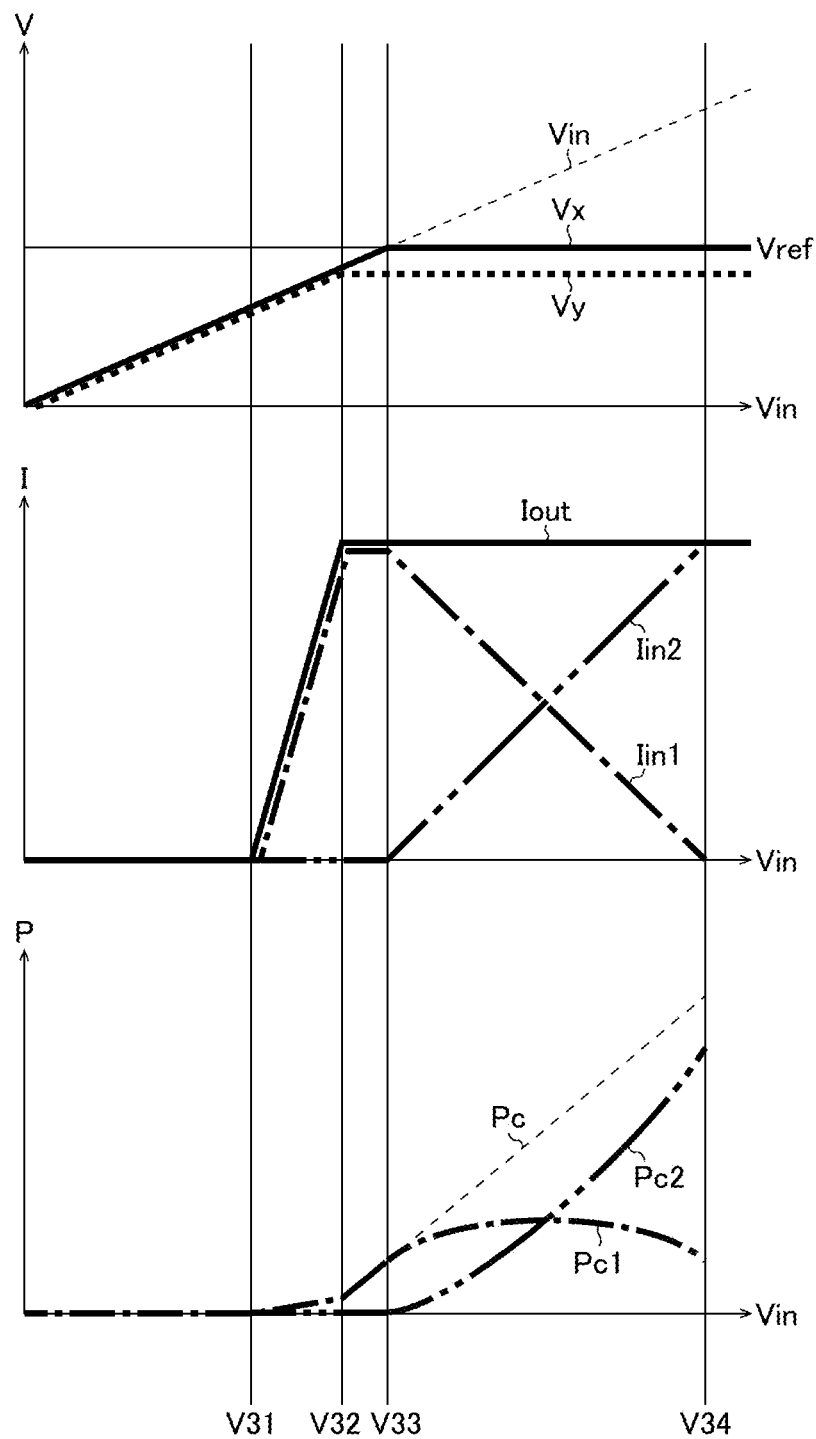
FIG. 7 is a diagram showing an example of power consumption distribution control performed in the third embodiment.
Figure 8A:
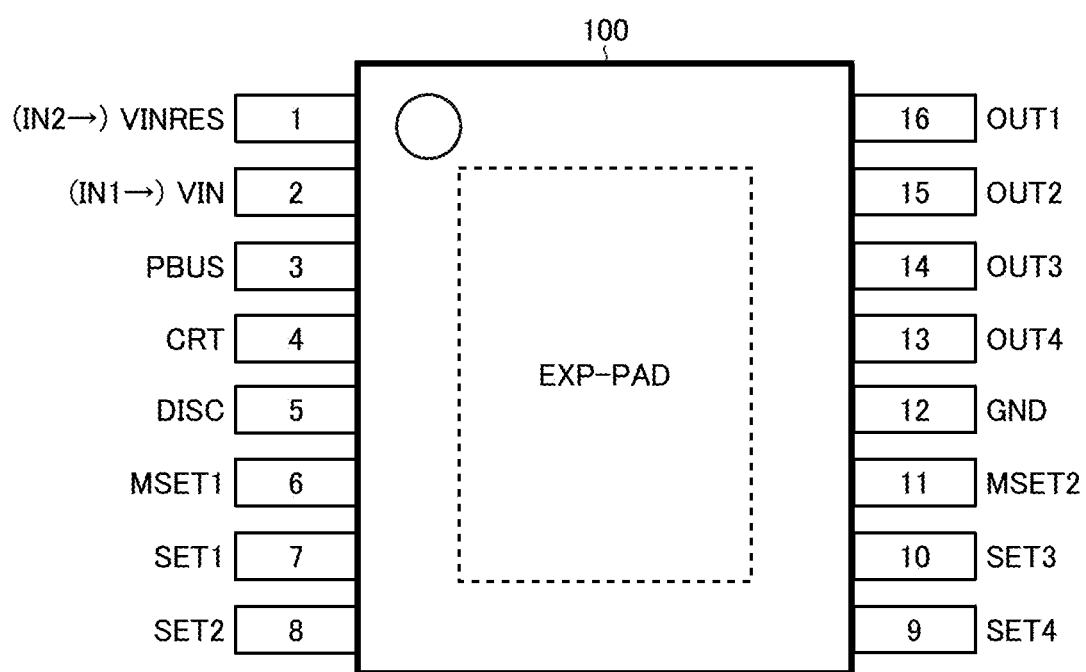
FIG. 8A is a diagram showing an arrangement of terminals (16 pins) in an LED driver IC (a first example)
Figure 8B:
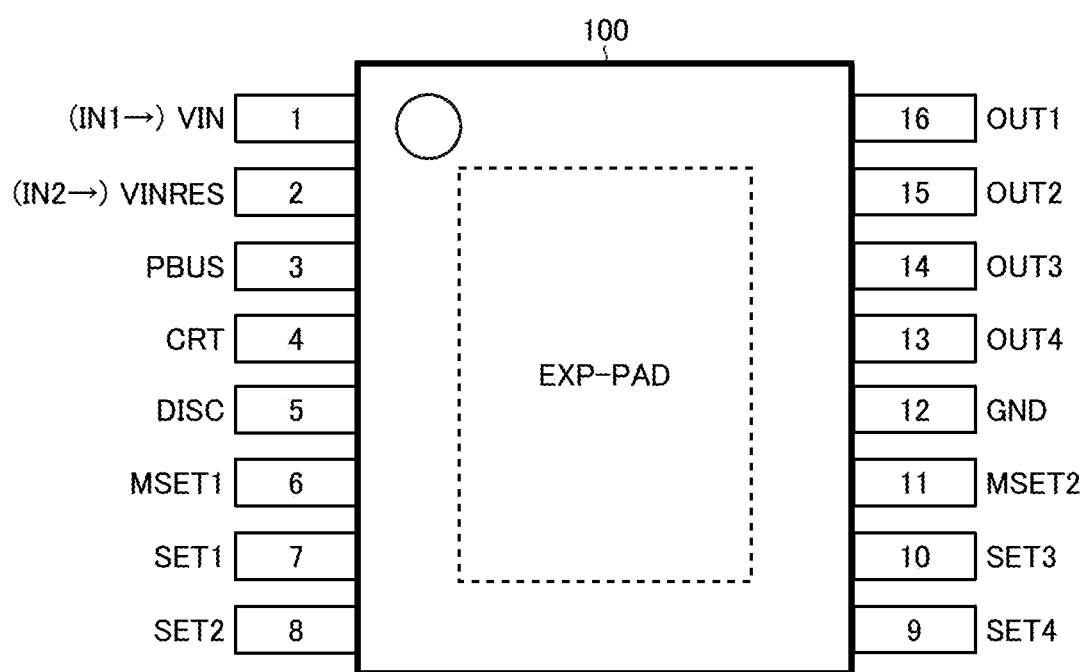
FIG. 8B is a diagram showing an arrangement of terminals (16 pins) in an LED driver IC (a second example)
Figure 8C:
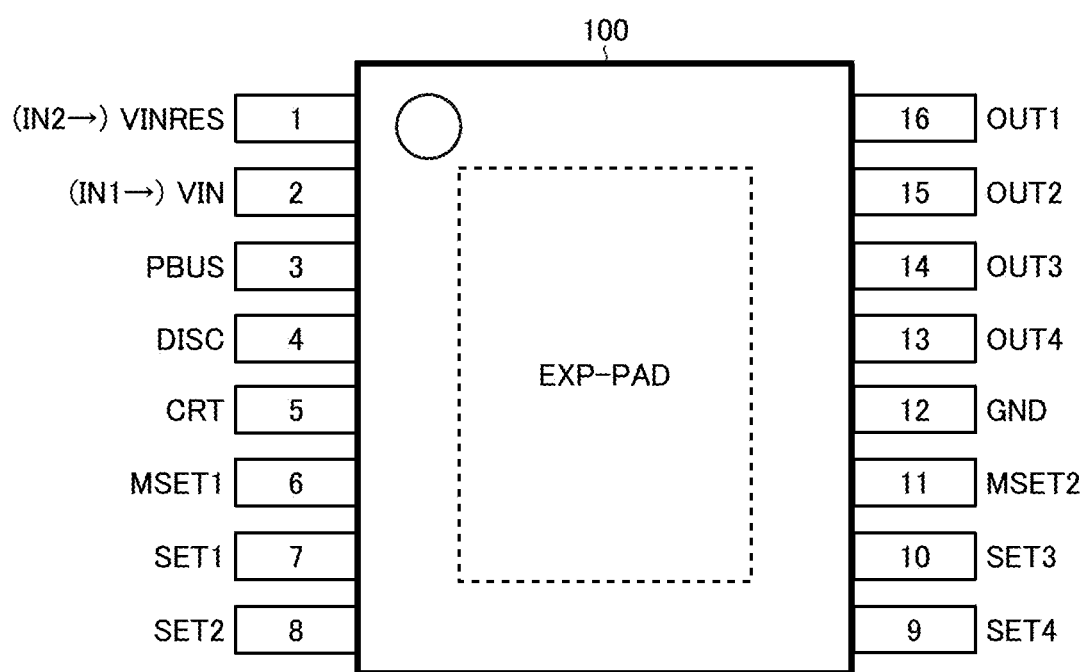
FIG. 8C is a diagram showing an arrangement of terminals (16 pins) in an LED driver IC (a third example)
Figure 8D:
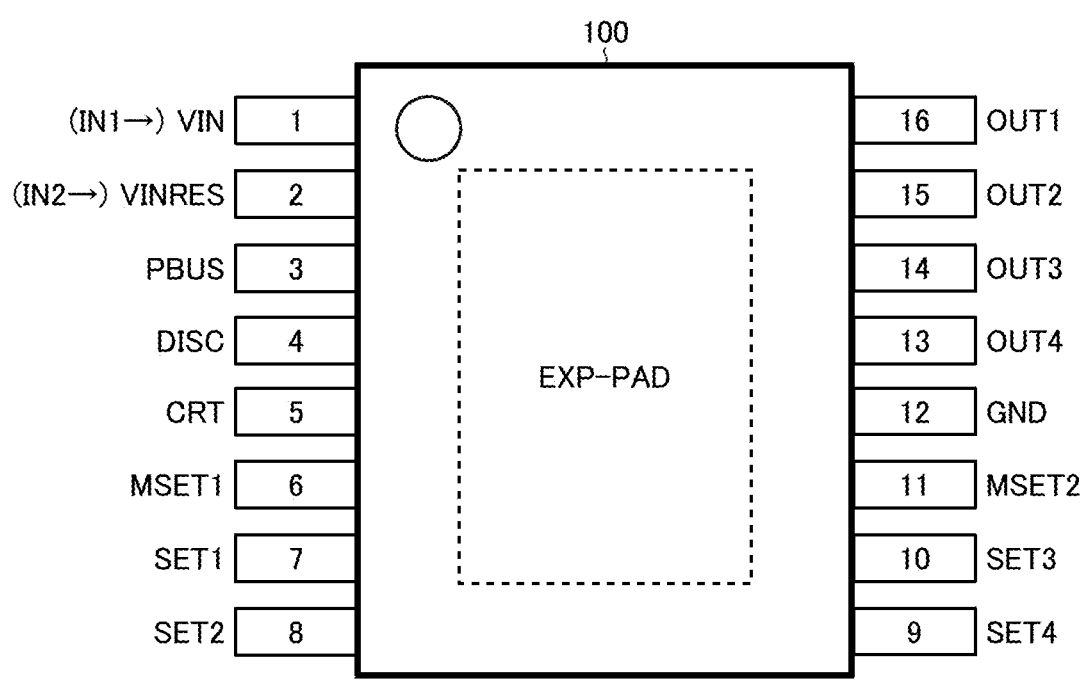
FIG. 8D is a diagram showing an arrangement of terminals (16 pins) in an LED driver IC (a fourth example)

FIG. 7 is a diagram showing an example of power consumption distribution control performed in the LED driver IC 100 of the third embodiment, and illustrates, as in FIG. 3, in order from top to bottom, a relationship between the input voltage Vin and various voltages (Vx, Vy), a relationship between the input voltage Vin and various currents (Iin1, Iin2, Iout), and a relationship between the input voltage Vin and various power consumptions (Pc', Pc2, Pc).

The basic operation of this embodiment is performed in the same manner as described previously, and can be understood simply by reading the voltage values V11 to V14 in FIG. 3 as the voltage values V31 to V34, respectively, in this figure.

However, in the LED driver IC 100 of this embodiment, the power consumption distribution function is turned on/off based not on the result of comparison between the difference value Vx−Vy and the threshold voltage Vth but on the result of comparison between the first terminal voltage Vx and the reference voltage Vref. Accordingly, "Vx−Vy<Vth" in the description of the first embodiment should be read as "Vx<Vref", and "Vx−Vy>Vth" in the description of the first embodiment should be read as "Vx>Vref".

Further, the example dealt with in this embodiment is based on the first embodiment (FIG. 2), but it may be based on the second embodiment (FIG. 4) instead. Specifically, in the LED lamp module 1 of this embodiment, the transistor 112 of the current distributor 110 may further be omitted.

<Arrangement of Terminals (16 Pins)>

FIG. 8A to FIG. 8D are diagrams showing arrangements of terminals (16 pins) in the LED driver IC 100. In each of the diagrams, in the LED driver IC 100, a 16-pin HTSSOP (heat-sink thin shrink small outline package) is adopted as the package. This package has a total of 16 pins drawn out of its two opposite sides in two directions (left and right directions on the drawing sheet) such that eight pins are arranged on each of the two opposite sides. Hereinafter, arrangements of terminals will be described with reference to FIG. 8A basically.

A VINRES terminal (pin 1) is a power distribution resistor connection terminal, and corresponds to the aforementioned second input terminal IN2. A VIN terminal (pin 2) is a source voltage input terminal, and corresponds to the aforementioned first input terminal IN1. A PBUS terminal (pin 3) is an abnormal-state flag outputting/output-current off control inputting terminal. A CRT terminal (pin 4) and a DISC terminal (pin 5) are CR timer setting terminals. An MSET1 terminal (pin 6) and an MSET2 terminal (pin 11) are mode setting terminals. A SET1 terminal (pin 7), a SET2 terminal (pin 8), a SET3 terminal (pin 10), and a SET4 terminal (pin 9) are output-current setting terminals for four channels. A GND terminal (pin 12) is a ground terminal. An OUT1 terminal (pin 16), an OUT2 terminal (pin 15), an OUT3 terminal (pin 14), and an OUT4 terminal (pin 13) are current output terminals for four channels. An EXP-PAD terminal, indicated by a broken line, functions as a heat dissipation pad.

Preferably, the VINRES terminal and the VIN terminal are arranged adjacent to each other as shown in FIG. 8A to FIG. 8D. However, as can be understood from comparison between FIG. 8A and FIG. 8B (or FIG. 8D), these two terminals may be arranged in the reverse order. Likewise, preferably, the CRT terminal and the DISC terminal are arranged adjacent to each other as shown in FIG. 8A to FIG. 8D. However, as can be understood from comparison between FIG. 8A and FIG. 8C (or FIG. 8D), these two terminals may be arranged in the reverse order.

The above-described four external terminals (VINRES, VIN, CRT, and DISC) are all connected to the power source E (a battery). Accordingly, it is desirable to design these four external terminals (VINRES, VIN, CRT, and DISC) to have higher withstand voltages than the other external terminals so that they can withstand connection to the power source E.

On the other hand, the external terminals (PBUS, GND, MSET1 and MSET2, SET1 to SET4, and OUT1 to OUT4) other than the above-described four external terminals are not connected to the power source E. Accordingly, it is basically sufficient for these external terminals (PBUS, GND, MSET1 and MSET2, SET1 to SET4, and OUT1 to OUT4) to be designed to have lower withstand voltages than the other external terminals.

However, as to the external terminals (PBUS, MSET1), which are adjacent to the four external terminals (VINRES, VIN, CRT, and DISC) mentioned above, it is desirable, as a measure against a short circuit between adjacent terminals, to design the external terminals (PBUS, MSET1) so as to have higher withstand voltages than the other external terminals.

That is, it is desirable to select, as an external terminal to be arranged adjacent to the four external terminals (VINRES, VIN, CRT, and DISC) mentioned above, an external terminal (for example, PBUS, MSET1, or MSET2) that is comparatively easy to design to have a high withstand voltage.

<Chip Layout>

FIG. 9 to FIG. 12 are diagrams showing examples of layout in a semiconductor chip sealed in the LED driver IC 100. A semiconductor chip 200 is a member cut out in a rectangular shape in plan view, and has integrated therein, besides the current distributor 110, the controller 120 and the current driver 130, which have been described previously, a current setter 140, which is configured to set the constant currents I1 to I4 for the channels, and an other-circuit portion 150 (including a reference power supply, a CR timer, a protect bus controller, and various protection circuits, etc.).

In the following description, of the four sides constituting the outer edge of the semiconductor chip 200, the left side on the drawing sheet is defined as a first side 201, the right side, which is opposite to the first side 201, is defined as a second side 202, the upper side is defined as a third side 203, and the lower side, which is opposite to the third side 203, is defined as a fourth side 204.

In this layout, the current distributor 110 is integrated, in plan view of the semiconductor chip 200, on the first-side-201 side of the semiconductor chip 200 (=closer to the first side 201 than the current driver 130). In this layout, a pad P11 (=corresponding to the source pad of the transistor 111 wirebonded to the first input terminal IN1) of the current distributor 110 is provided close to the first side 201, and a pad P12 (=corresponding to the drain pad of the transistor 111 wirebonded to the second input terminal IN2) is provided close to the third side 203. Such an arrangement of pads will be described later in detail.

On the other hand, in the present layout, the current driver 130 is integrated, in plan view of the semiconductor chip 200, on the second-side-202 side of the semiconductor chip 200 (=closer to the second side 202 than the current distributor 110).

That is, the current distributor 110 and the current driver 130 are arranged separate from each other, on the first-side-201 side and on the second-side-202 side, respectively, of the semiconductor chip 200.

The adoption of such a chip layout makes it possible to gather power-input side pins (for example, pins 1, 2, 4, and 5 in FIG. 8) of the plurality of pins provided in the LED driver IC 100 on the first-side-201 side of the semiconductor chip 200 to extend in a first direction and gather power-output side pins (for example, pins 13 to 16 in FIG. 8) on the second-side-202 side of the semiconductor chip 200 to extend in a second direction which is a direction opposite to the first direction. As a result, conductors connected to the power-input side pins and conductors connected to the power-output side pins do not intersect each other, and this makes it possible to simplify the layout in the PCB (printed circuit board) on which the LED driver IC 100 is mounted.

Further, as shown also in FIG. 2 referred to previously, for example, the current driver 130 includes the constant current sources 131 to 134 respectively connected between the current distributor 110 and the output terminals OUT1 to OUT4. In particular, in the present layout, the constant current sources 131 to 134 are arranged in a direction (=X-axis direction) that is along the second side 202 in plan view of the semiconductor chip 200. Here, pads P31 to P34 (=output pads respectively wirebonded to the output terminals OUT1 to OUT4) of the constant current sources 131 to 134, respectively, are all provided close to the second side 202. Further, as shown in FIG. 12, the other-circuit portion 150 may be laid between the constant current sources 131 to 134.

Here, preferably, in plan view of the semiconductor chip 200, the current distributor 110 is integrated at a position between a position (see FIG. 9) adjacent to the constant current source 131 which is located closest to the third side 203 of the semiconductor chip 200 and a position (see FIG. 11) adjacent to the constant current source 134 which is located farthest from the third side 203, and it is desirable that the current distributor 110 be integrated close to the center position (see FIG. 10, FIG. 12) between two opposite ends of the constant current sources 131 to 134 in the direction (the x-axis direction) in which they are arranged.

Figure 9:
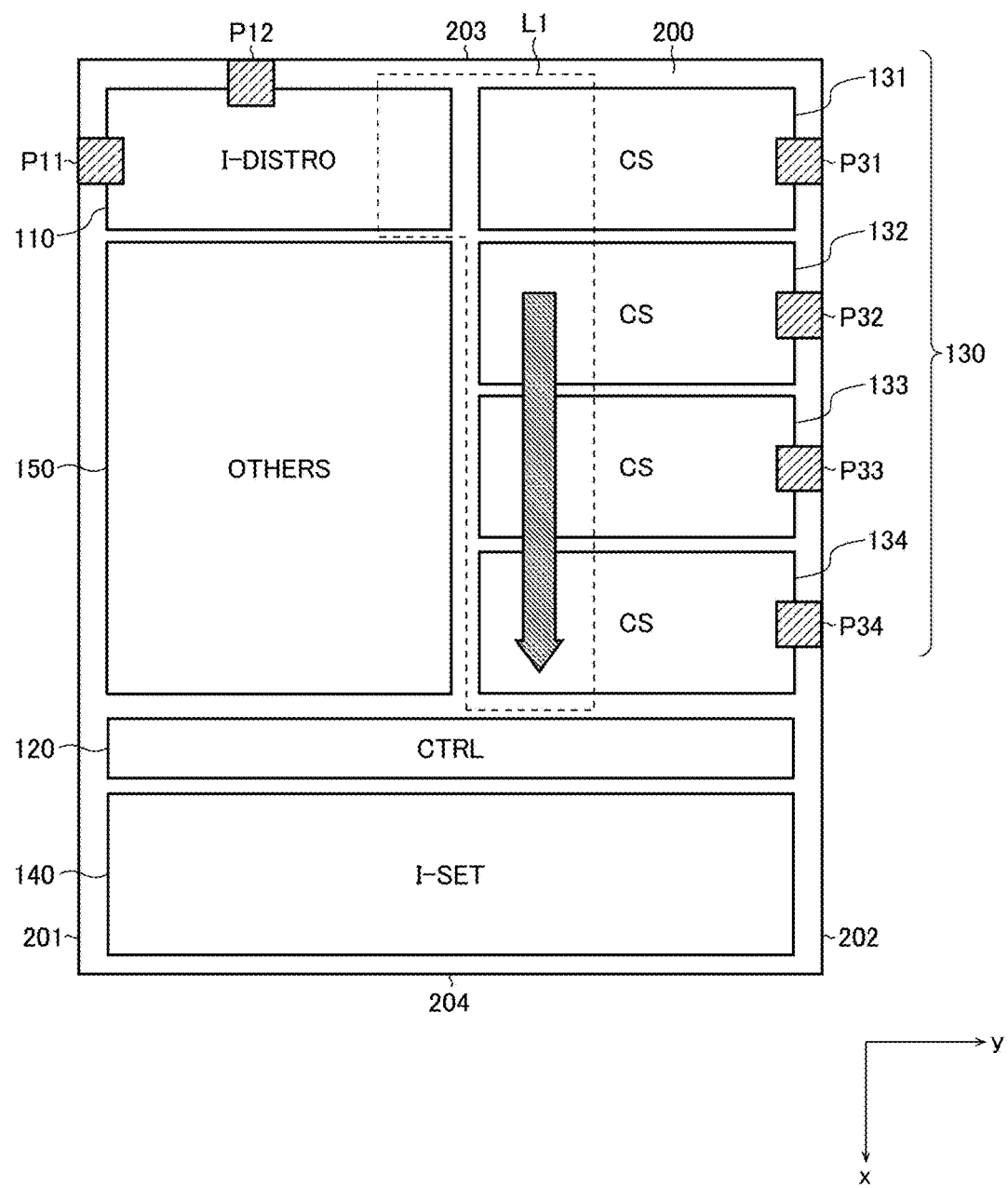
FIG. 9 is a diagram showing a first layout in a semiconductor chip.
Figure 10:
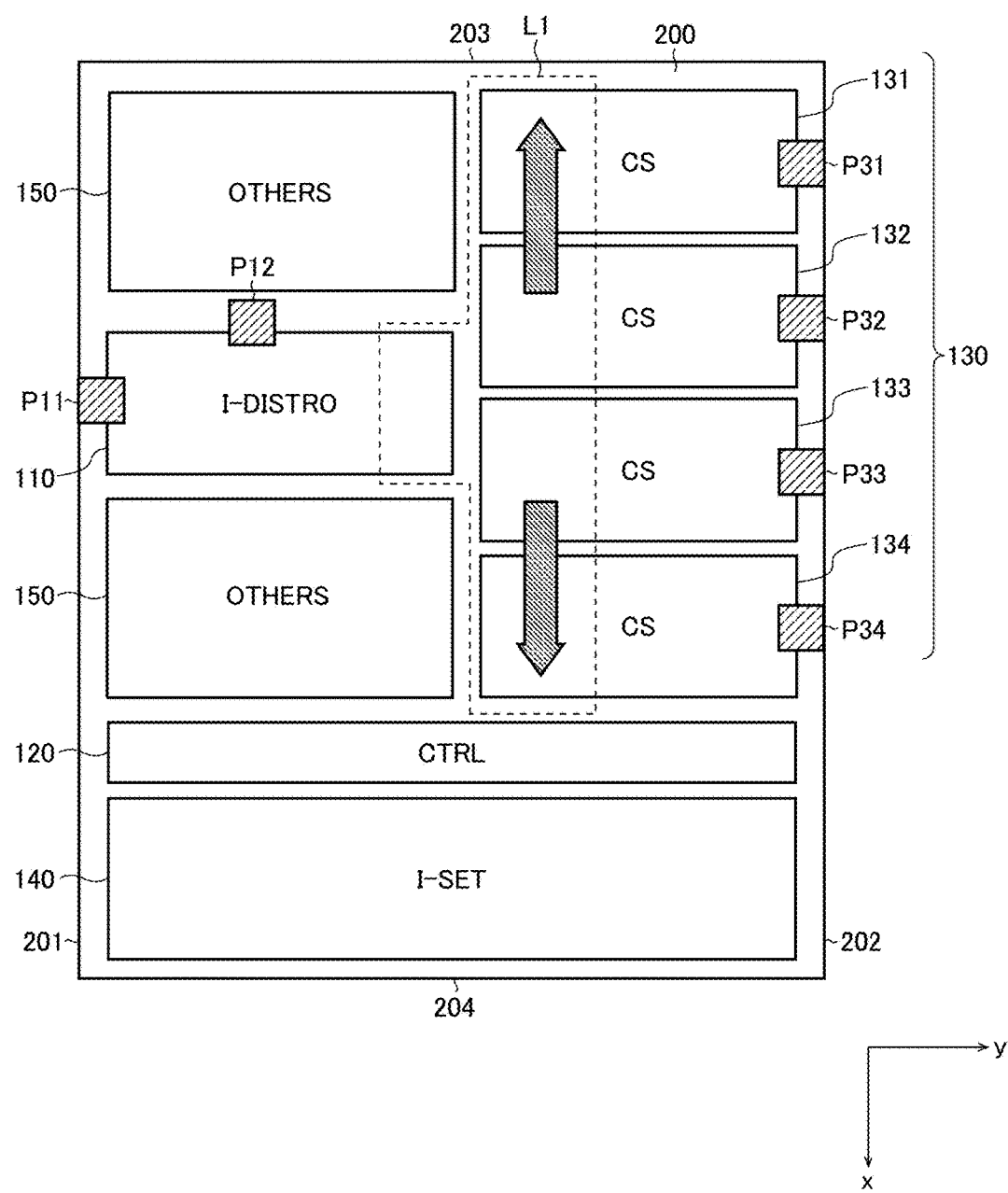
FIG. 10 is a diagram showing a second layout in a semiconductor chip.
Figure 11:
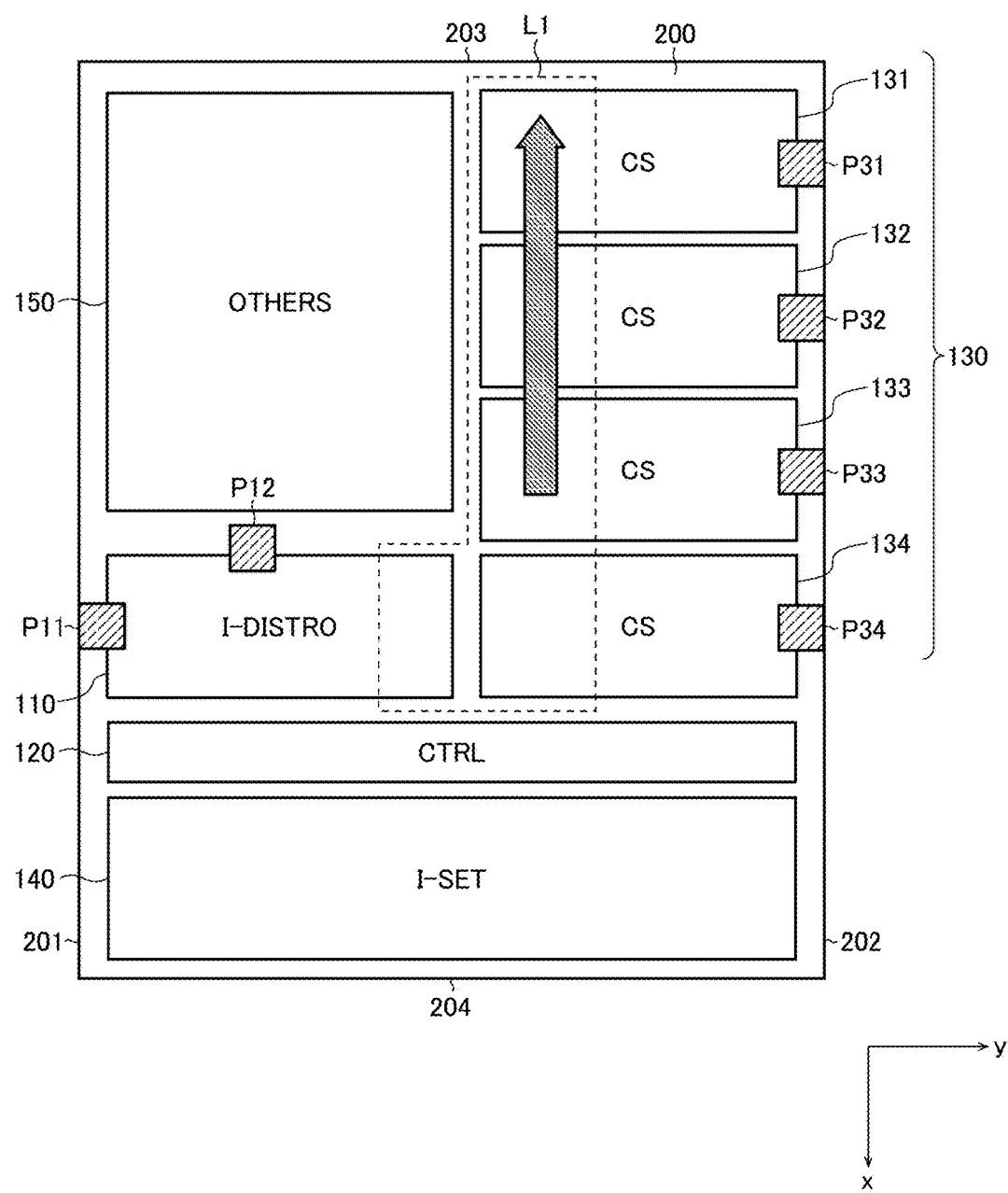
FIG. 11 is a diagram showing a third layout in a semiconductor chip.
Figure 12:
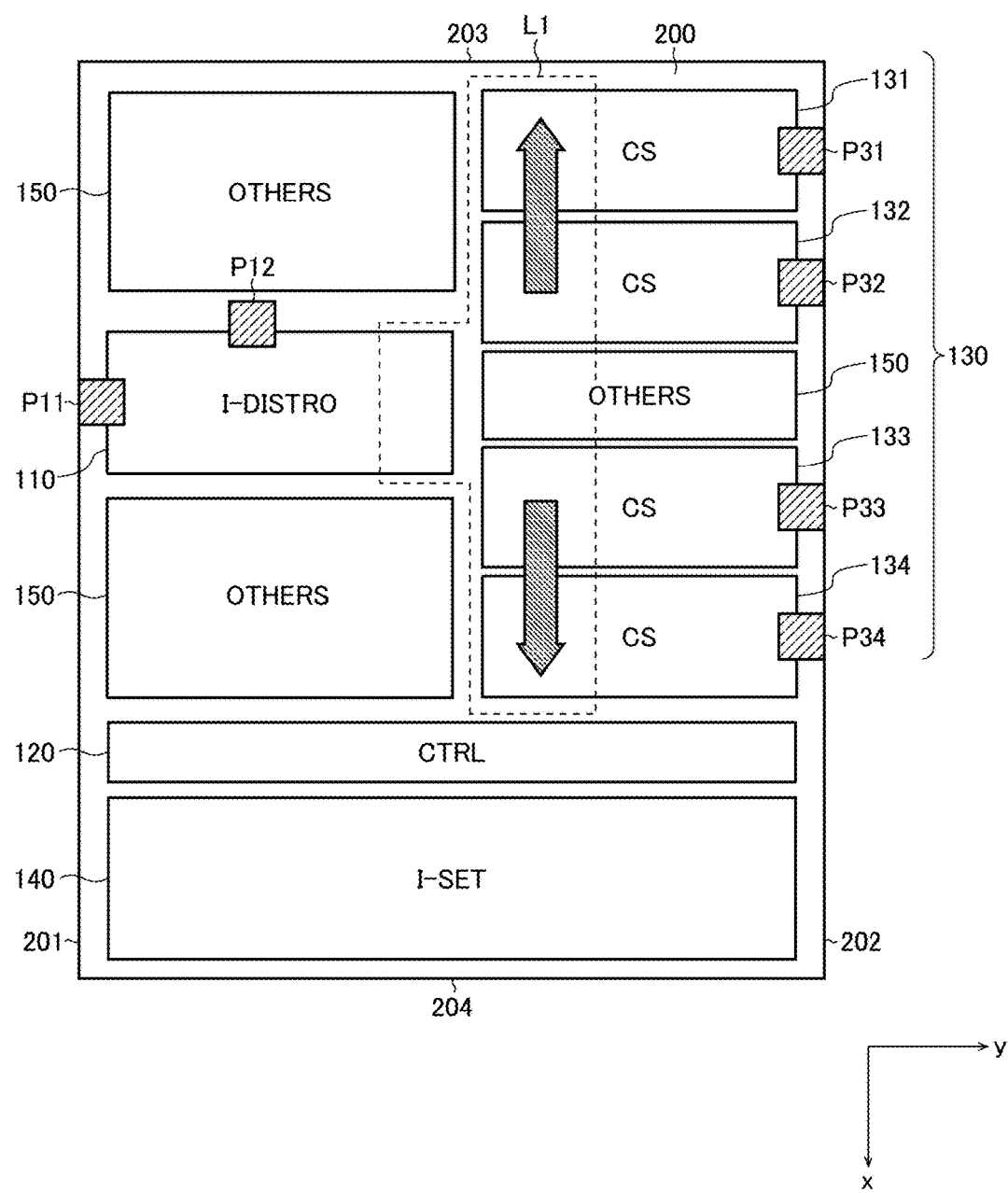
FIG. 12 is a diagram showing a fourth layout in a semiconductor chip.

In particular, according to the layouts shown in FIG. 10 and FIG. 12, in comparison with the layouts shown in FIG. 9 and FIG. 11, as to the resistance component of a conductor L1 laid from the current distributor 110 through the constant current sources 131 to 134, it is possible to reduce its maximum value (=the conductor resistance to such one of the constant current sources as is located farthest from the current distributor 110).

For example, with the layout shown in FIG. 9, it is possible to minimize the conductor resistance to the constant current source 131, which is adjacent to the current distributor 110, but the current resistance to the constant current source 134, which is farthest from the current distributor 110, becomes very large. On the other hand, with the layout shown in FIG. 11, it is possible to minimize the conductor resistance to the constant current source 134, which is adjacent to the current distributor 110, but the conductor resistance to the constant current source 131, which is farthest from the current distributor 110, becomes very large.

In contrast, with the layouts shown in FIG. 10 and FIG. 12, the length of the conductor from the current distributor 110 to the constant current sources 131 and 134, which are farthest from the conductor current distributor 110, can be reduced, and thus the conductor resistance to them can also be reduced.

The LED driver IC 100 is required to have as small an input-output voltage as possible. For this purpose, it is important to lower the on-resistance of the transistor 111 (or 112) constituting the current distributor 110, and further, to reduce the conductor resistance to a constant current source that is farthest from the current distributor 110. Thus, it can be said that it is desirable to adopt the layout shown in FIG. 10 or FIG. 12 among those shown in FIG. 9 to FIG. 12.

<Arrangement of Pads>

Figure 13:
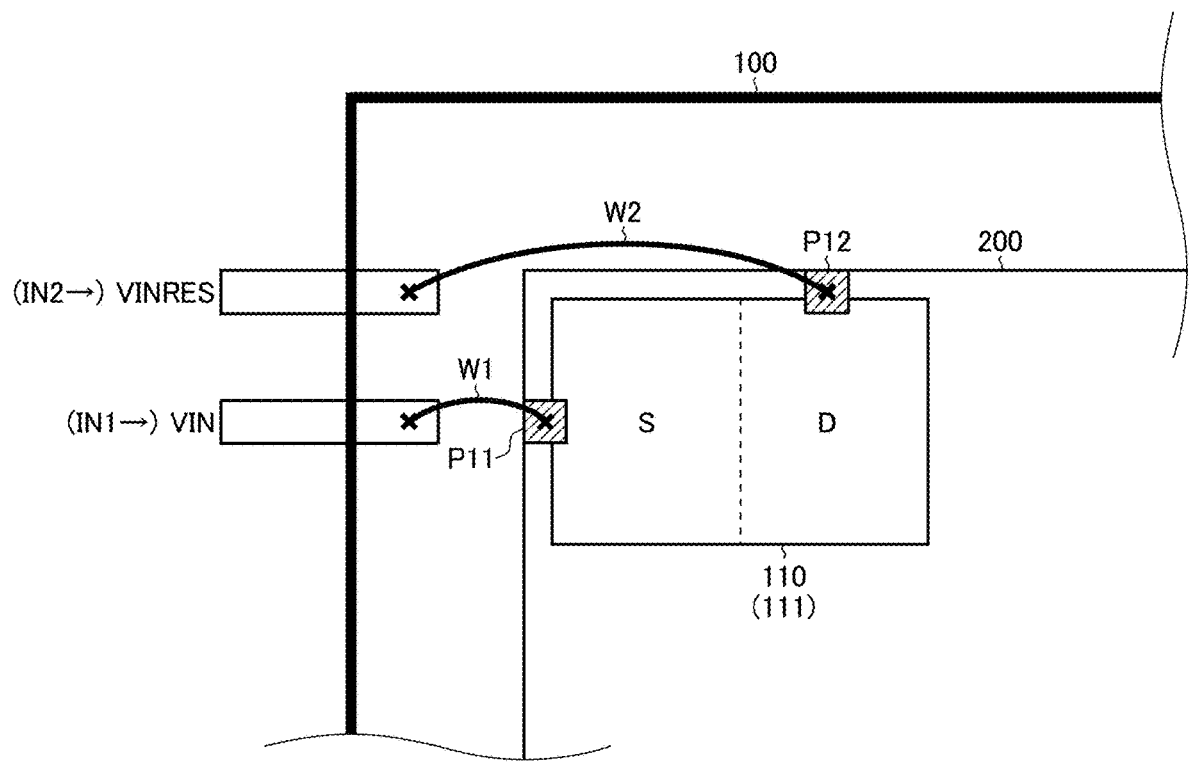
FIG. 13 is a diagram showing an arrangement of pads in a current distributor.

FIG. 13 is a diagram showing an arrangement of pads in the current distributor 110 (=the transistor 111) shown in FIG. 4. As shown in this figure, the transistor 111 includes a source region S, a source pad P11 which is provided immediately close to the source region S and is bonded to the VIN terminal (=the first input terminal IN1) via a wire W1, a drain region D, and a drain pad P12 which is provided immediately close to the drain region D and is bonded to the VINRES terminal (=the second input terminal IN2) via a wire W2.

Thus, as to the source pad P11 and the drain pad P12 of the transistor 111, it is desirable that, without laying unnecessarily long conductor inside the semiconductor chip 200, the two pads be respectively provided immediately close to the source region S and the drain region D and wirebonded to lead frames (=the VIN terminal and the VINRES terminal).

<Arrangement of Terminals (7 Pins)>

Figure 14:
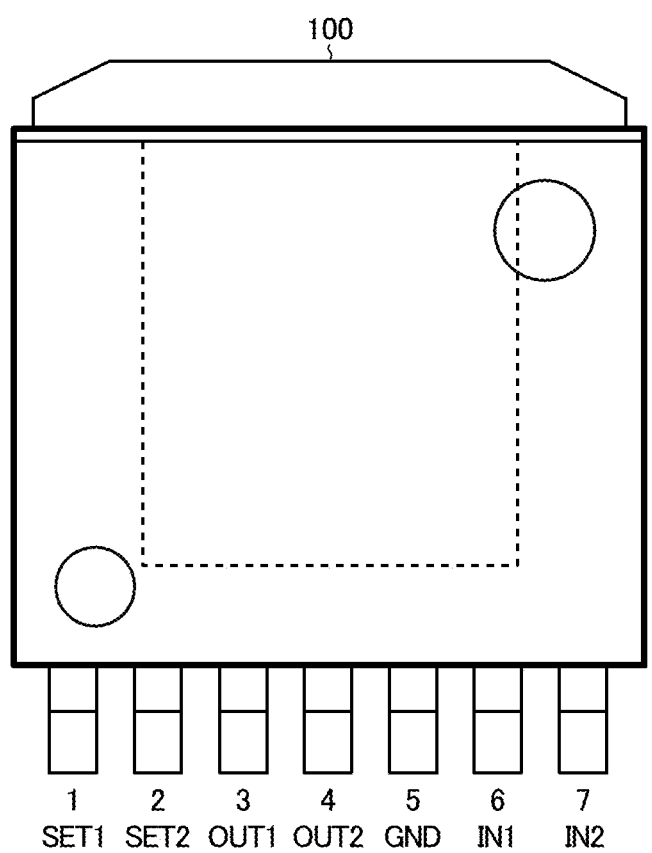
FIG. 14 is a diagram showing an arrangement of terminals (7 pins) in an LED driver IC.

FIG. 14 is a diagram showing an arrangement of terminals (7 pins) in the LED driver IC 100. FIG. 8 referred to previously shows 16-pin HTSSOP packages as examples, but when the number of output channels is small, as shown in this figure, it is possible to adopt a package having pins drawn out only in one direction.

Here, a SET1 terminal (pin 1) and a SET2 terminal (pin 2) are output-current setting terminals for two channels. An OUT1 terminal (pin 3) and an OUT2 terminal (pin 4) are current output terminals for two channels. A GND terminal (pin 5) is a ground terminal. An IN1 terminal (pin 6) is a source voltage input terminal, and corresponds to the aforementioned first input terminal IN1. An IN2 terminal (pin 7)

is a power-distribution-resistor connection terminal, and corresponds to the aforementioned second input terminal IN2.

Preferably, the IN1 terminal and the IN2 terminal are arranged adjacent to each other. Here, the two terminals may be arranged in the reverse order. Here, it is desirable to design these two external terminals (IN1, IN2) to have high withstand voltages so that they can withstand connection to the power source E.

On the other hand, it is basically sufficient for the external terminals (SET1, SET2, OUT1, OUT2, GND) other than the above-mentioned two terminals to be designed to have low withstand voltages. However, as to the external terminal (GND) adjacent to the two external terminals (IN1, IN2) mentioned above, it is desirable, as a measure against a short circuit between adjacent terminals, to design the external terminal (GND) to have a high withstand voltage.

That is, it is desirable to select, as an external terminal to be arranged adjacent to the above-mentioned two external terminals (IN1, IN2), an external terminal (for example, GND) that is comparatively easy to design to have a high withstand voltage.

<Vehicle (Motorcycle, Four-Wheeled Automobile)>

Figure 15:
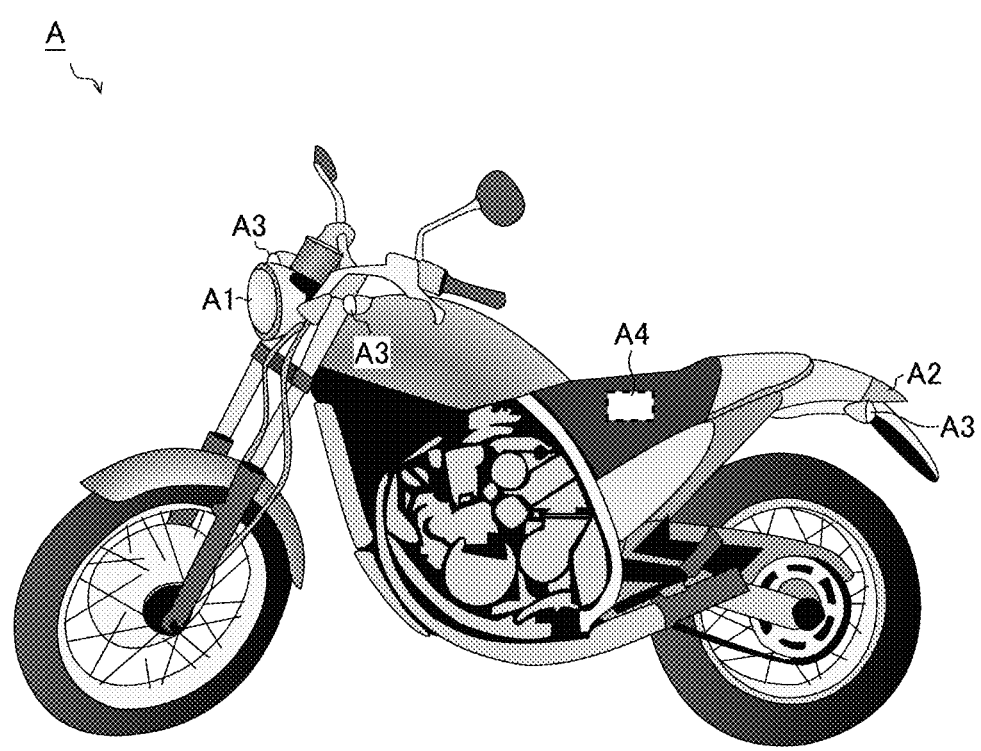
FIG. 15 is an external view of a motorcycle.

FIG. 15 is an external view of a motorcycle. A motorcycle A shown in this figure is an example of what is called a medium-sized motorcycle (=corresponding to an ordinary motorcycle defined, in the Road Traffic Law of Japan, as belonging to the class of motorcycles with engine displacement over 50 cc but not over 400 cc). The motorcycle A has LED lamp modules A1 to A3 (more specifically, an LED headlamp module A1, an LED rear-lamp module A2, and LED blinker-lamp modules A3), and a battery A4 as a power source for these lamp modules.

Figure 16:
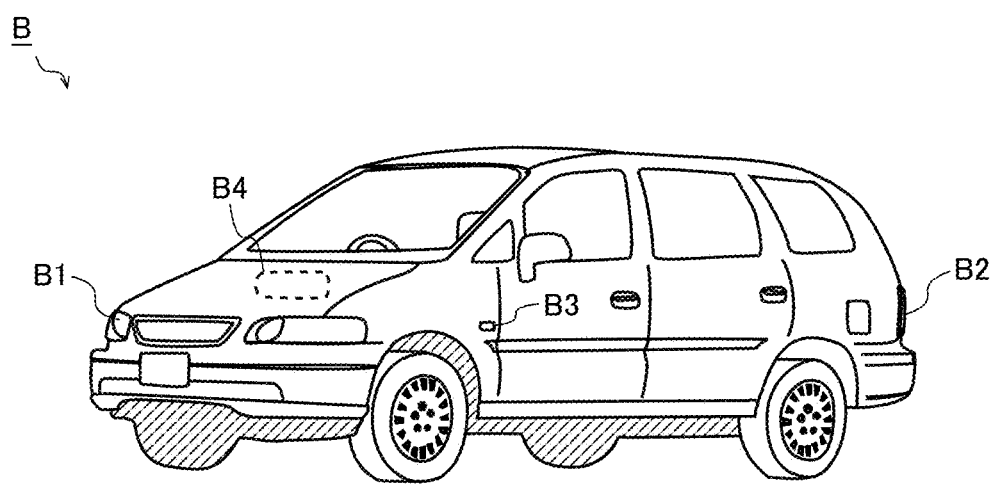
FIG. 16 is an external view of a four-wheeled automobile.
Figure 17:
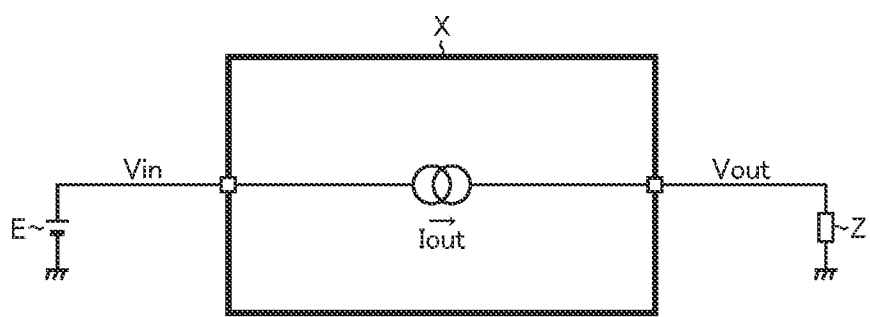
FIG. 17 is a diagram showing a conventional example of a load drive device.

FIG. 16 is an external view of a four-wheeled automobile. A four-wheeled automobile B shown in this figure has LED lamp modules B1 to B3 (more specifically, LED headlamp modules B1, LED rear-lamp modules B2, and LED blinker-lamp modules B3), and a battery B4 as a power source for these lamp modules.

For convenience of illustration, the mounting positions of the LED lamp modules A1 to A3 and B1 to B3 and the batteries A4 and B4 in FIGS. 15 and 16 may be different from reality.

As has been discussed above, with the LED lamp module 1 (see FIG. 2, FIG. 4, and FIG. 6) using the LED driver IC 100 provided with the power consumption distribution function, no unnecessarily large printed circuit board is necessary. Accordingly, the LED lamp module 1 can be preferably used in any of the LED headlamp modules A1 and B1, the LED rear-lamp modules A2 and B2, and the LED blinker-lamp modules A3 and B3, of which all have restrictions as to the board area.

<Additional Description A>

An additional description will be given in connection with FIG. 8A to FIG. 8D referred to previously. As to a first terminal for receiving a first current from a power source and a second terminal for receiving a second current from the power source via an external resistor, it is preferable that these terminals be both provided on a first side of a package.

Here, preferably, the first terminal is provided at one end of the first side, and the second terminal is provided adjacent to the first terminal.

Or, the second terminal may be provided at one end of the first side, and the first terminal may be provided adjacent to the second terminal.

On the first side, in addition to the first and second terminals, there may further be provided a third terminal that is connected to the power source.

On the first side, in addition to the first to third terminals, there may further be provided a fourth terminal that is not connected to the power source.

Further, preferably, a fifth terminal for outputting a current to a load is provided on a second side of four sides of the package, the second side being a side different from the first side.

Here, preferably, the second side is a side that is opposite to the first side.

As the fifth terminal, a plurality of fifth terminals may be provided.

Preferably, the plurality of fifth terminals are provided adjacent to each other.

Preferably, the fifth terminal is provided at one end of the second side.

Further, preferably, a sixth terminal for connecting a ground terminal is provided next to the fifth terminal.

Further, preferably, a seventh terminal for heat dissipation is provided on the rear face of the package.

<Additional Description B>

Next, an additional description will be given in connection with FIG. 9 to FIG. 13 referred to previously. It is preferable that a current distributor and a current driver be arranged separate from each other such that one is arranged on a first-side side of a semiconductor chip and the other is arranged on a second-side side of the semiconductor chip.

Here, preferably, a plurality of constant current sources included in the current driver are arranged in a direction along the second side of the semiconductor chip in plan view of the semiconductor chip.

Further, preferably, in plan view of the semiconductor chip, the current distributor is integrated at a position between a position adjacent to such a constant current source of the plurality of constant current sources as is located closest to a third side of the semiconductor chip and a position adjacent to such a constant current source of the plurality of constant current sources as is located farthest from the third side.

Further, preferably, an other-circuit portion is integrated in a region adjacent to both the current distributor and the current driver in plan view of the semiconductor chip, the other-circuit portion including a reference power supply configured to generate an internal reference voltage, a CR timer for PWM (pulse width modulation) controlling an output current fed to the load, a protect bus controller configured to exchange fault signals with outside the device, various protection circuits, etc.

Further, preferably, in plan view of the semiconductor chip, the current distributor is integrated at a position between a plurality of parts into which the other-circuit portion is divided.

Further, preferably, in plan view of the semiconductor chip, at least part of the other-circuit portion is integrated at a position between the plurality of constant current sources.

Preferably, the current distributor, the current driver, and the other-circuit portion are arranged on a third-side side, and a controller configured to integrally control the operation of the semiconductor chip and a current setter configured to set the current value of an output current fed to a load are arranged on a fourth-side side, the third side and the fourth side being opposite to each other.

Here, preferably, the current setter is located closer to the fourth side than the controller.

As to a transistor constituting the current distributor, preferably a first pad connected to a source region is arranged on the first-side side, and a pad connected to a drain region is arranged on the third-side side.

Preferably, a first wire via which the first pad and the first terminal are connected with each other is shorter than a second wire via which the second pad and the second terminal are connected with each other.

Preferably, in plan view of the semiconductor chip, the first wire extends from the first pad in a direction parallel to the third side to be connected with the first terminal, and the second wire extends from the second pad in the direction parallel to the third side to be connected with the second terminal.

<Additional Description C>

Next, an additional description will be given in connection with FIG. 14 referred to previously. It is preferable to provide, on one side of a package, all terminals including a first terminal for receiving a first current from a power source and a second terminal for receiving a second current from the power source via an external resistor.

Here, preferably, the second terminal is provided at one end of the one side of the package and the first terminal is provided adjacent to the second terminal.

Or, the first terminal may be provided at the one end of the one side of the package and the second terminal may be provided adjacent to the first terminal.

Preferably, a third terminal for connecting a ground end is provided adjacent to the first or second terminal.

Preferably, the third terminal is provided between the first or second terminal and a fourth terminal for outputting a current to a load.

As the fourth terminal, a plurality of fourth terminals may be provided.

Preferably, the plurality of fourth terminals are provided adjacent to each other.

Preferably, at the other end of the one side of the package, a fifth terminal is provided which is not connected to the power source.

Other Modified Examples

The above-discussed embodiments have dealt with examples where the present invention is applied to a multi-channel LED driver IC. However, the application target of the present invention is not limited to a multi-channel LED driver IC at all, and the present invention is widely applicable to load drive devices in general where power consumption needs to be restricted.

The above-discussed embodiments have dealt with, as examples, configurations where an LED is used as a light emitting element, but, for example, it is also possible to use an organic EL (electro-luminescence) element as a light emitting element.

Thus, in addition to the above embodiments, it is possible to add various modifications to the various technical features disclosed herein without departing from the spirit of the technological creation. In other words, it should be understood that the above embodiments are examples in all respects and are not limiting; the technological scope of the present invention is not limited to the above description of the embodiments; and all modifications within the scope of the claims and the meaning equivalent to the claims are covered.

INDUSTRIAL APPLICABILITY

The invention disclosed herein is usable, for example, in a multi-channel LED driver IC incorporated in an LED lamp module for vehicles (motorcycles, four-wheeled automobiles, etc.).

LIST OF REFERENCE SIGNS 1 electric appliance (LED lamp module)
100 load drive device (multi-channel LED driver IC)
110 current distributor
111, 112 P-channel MOS field-effect transistor
120 controller
121 input detector
121a resistor
121b current source
122 output detector
123 differential amplifier
130 current driver
131 to 134 constant current source
140 current setter
150 other-circuit portion
200 semiconductor chip
201 first side
202 second side
203 third side
204 fourth side
A motorcycle (vehicle)
B four-wheeled automobile (vehicle)
A1, B1 LED headlamp module
A2, B2 LED rear-lamp module
A3, B3 LED blinker-lamp module
A4, B4 battery
D drain region
E power source (battery)
IN1, IN2 input terminal
L1 conductor (current path)
OUT, OUT1 to OUT4 output terminal
P11 pad (source pad)
P12 pad (drain pad)
P31, P32, P33, P34 pad
R external resistor
S source region
W1, W2 wire
Z load (LED light source)
Z1 to Z4 LED string

What is claimed is:

1. A semiconductor device comprising:
   a first voltage side terminal connected to an external first voltage,
   a second voltage side terminal connected to an external second voltage different from the external first voltage,
   a current driver configured to perform current control of an output current between the first voltage side terminal and the second voltage side terminal,
   a current distributor configured to distribute the output current to a first path to the first voltage side terminal and to an internal bypass path that branches from the first path, and
   a bypass terminal to which the internal bypass path is connected and is arranged to be connected by one terminal of an external resistor which is arranged to be connected between the external first voltage and the external second voltage.

2. The semiconductor device according to claim 1, wherein the external first voltage is a power source.

3. The semiconductor device according to claim 2, wherein the first voltage side terminal is arranged to be directly connected to the power source.

4. The semiconductor device according to claim 2, wherein the first voltage side terminal is arranged to be connected to another terminal of the external resistor.

5. The semiconductor device according to claim 2, wherein the second voltage side terminal is arranged to be connected to an external load.

6. The semiconductor device according to claim 1, wherein the current distributor is configured to distribute the output current to the first path and the internal bypass path such that a sum of a current to the first path and a current to the internal bypass path is equal to the output current.

7. The semiconductor device according to claim 1, wherein the current distributor includes:
a first transistor in the first path, and
the semiconductor device further includes a controller configured to control the first transistor.

8. The semiconductor device according to claim 7, wherein the current distributor further includes:
a second transistor in the internal bypass path, and
the controller configured to control the second transistor.

9. The semiconductor device according to claim 8, wherein the controller includes:
a bypass terminal voltage detector configured to generate a first differential input voltage from voltage at the bypass terminal,
a second terminal voltage detector configured to generate a second differential input voltage from the voltage at the second voltage side terminal, and
a differential amplifier configured to generate a control signal for the current distributor according to a difference value between the first differential input voltage and the second differential input voltage.

10. The semiconductor device according to claim 1, wherein the current driver is configured to perform constant current control of the output current.

11. The semiconductor device according to claim 1, wherein, in a plan view of a semiconductor device,
the first voltage side terminal is arranged on a first side of the semiconductor device, and
the second voltage side terminal is arranged on a second side of the semiconductor device opposite to the first side of the semiconductor device.

12. The semiconductor device according to claim 11, wherein the bypass terminal is on another side adjacent to the first voltage side terminal on the first side of the semiconductor device.

13. The semiconductor device according to claim 11, wherein the current driver and the current distributor are integrated in a semiconductor chip of the semiconductor device, and
wherein, in a plan view of the semiconductor chip,
the current distributor is arranged on a first side of the semiconductor chip which is close to the first side of the semiconductor device, and
the current driver is arranged on a second side of the semiconductor chip which is close to the second side of the semiconductor device.

14. A semiconductor device comprising:
a first voltage side terminal arranged to be connected to an external first voltage,
a second voltage side terminal arranged to be connected to an external second voltage different from the external first voltage,
a bypass terminal adjacent to the first voltage side terminal and arranged to be connected to one terminal of an external resistor which is arranged to be connected to the external first voltage at another terminal of the external resistor,
a current driver configured to perform current control of an output current between the first voltage side terminal and the second voltage side terminal, and
a current distributor configured to distribute the output current of the current driver to a first current to the first voltage side terminal and a bypass current to the bypass terminal on a side of the first voltage side terminal of the output current with respect to the current driver.

15. The semiconductor device according to claim 14, wherein the external first voltage is a power source.

16. The semiconductor device according to claim 15, wherein the first voltage side terminal is arranged to be directly connected to the power source.

17. The semiconductor device according to claim 16, wherein the second voltage side terminal is arranged to be connected to an external load.

18. The semiconductor device according to claim 14, wherein the current distributor includes:
a first transistor in a path which is configured to flow the first current, and
the semiconductor device further includes a controller configured to control the first transistor.

19. The semiconductor device according to claim 18, wherein the current distributor further includes a second transistor in a path which is configured to flow the bypass current, and wherein the controller also configured to control the second transistor.

20. The semiconductor device according to claim 19, wherein the controller includes:
a first input detector configured to generate a first differential input voltage from the external first voltage,
a bypass input detector configured to generate a second differential input voltage from a voltage of the bypass terminal, and
a differential amplifier configured to generate a control signal for the current distributor according to a difference value between the first differential input voltage and the second differential input voltage.

21. The semiconductor device according to claim 14, wherein, in a plan view of a semiconductor device,
the first voltage side terminal is arranged on a first side of the semiconductor device, and
the second voltage side terminal is arranged on a second side of the semiconductor device opposite to the first side of the semiconductor device.

22. The semiconductor device according to claim 21, wherein the bypass terminal is arranged on the first side of the semiconductor device.

23. The semiconductor device according to claim 21, wherein the current driver and the current distributor are integrated in a semiconductor chip of the semiconductor device, and
wherein, in a plan view of the semiconductor chip,
the current distributor is arranged on a first side of the semiconductor chip, and
the current driver is arranged on a second side of the semiconductor chip which is opposite to the first side of the semiconductor chip.

24. An electronic module comprising:
a semiconductor device on a module, board,
an external resistor with one terminal connected to a first terminal of the semiconductor device, wherein the first terminal of the semiconductor device is connected to an external first voltage, and a second terminal of the semiconductor device is connected to an external second voltage different from the external first voltage, and wherein the semiconductor device includes:

a current driver configured to perform current control of an output current between the first terminal and the second terminal, a current distributor configured to distribute the output current to a first path to the first terminal and to an internal bypass path that branches from the first path, and a bypass terminal to which the internal bypass path is connected and arranged to be connected by another terminal of the external resistor.

* * * * *